(12) United States Patent
Tomita et al.

(10) Patent No.: US 6,307,806 B1
(45) Date of Patent: Oct. 23, 2001

(54) SEMICONDUCTOR INTEGRATED CIRCUIT AND METHOD OF OPERATING THE SAME

(75) Inventors: Hiroyoshi Tomita; Naoharu Shinozaki, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/652,162

(22) Filed: Aug. 31, 2000

(30) Foreign Application Priority Data

Sep. 30, 1999 (JP) .................................................. 11-279791
Jun. 6, 2000 (JP) .................................................. 12-168922

(51) Int. Cl.$^7$ ...................................................... G11C 8/00
(52) U.S. Cl. ...................................... 365/233; 365/230.03
(58) Field of Search .............................. 365/233, 230.03

(56) References Cited

U.S. PATENT DOCUMENTS 5,384,745 * 1/1995 Konishi et al. .................. 365/230.03

FOREIGN PATENT DOCUMENTS 7-141870   6/1995 (JP) .

* cited by examiner

Primary Examiner—David Nelms
Assistant Examiner—M. Tran
(74) Attorney, Agent, or Firm—Arent Fox Kintner Plotkin & Kahn, PLLC

(57) ABSTRACT

A command receiving circuit receives a command signal for determining a circuit operation, in synchronization with a clock signal and it outputs the received command signal as an internal command signal. An address switching circuit permits transmission of an address signal to an internal circuit upon receiving the command signal. The internal circuit receives the address signal before the reception of the command signal, thereby to start its operation. As a result, the internal circuit can be operated at high speed. Besides, the address switching circuit inhibits the transmission of the address signal to the internal circuit upon receiving the internal command signal or the clock signal. Therefore, even when the level of the address signal has changed after the reception of the command signal, the change does not lead to operating the internal circuit. Accordingly, the power consumption of the semiconductor integrated circuit is reduced. Meanwhile, the semiconductor integrated circuit comprises a plurality of memory cores and a bank switch for selecting the memory cores. The bank switch feeds the address signal to predetermined memory core(s) of the memory cores in accordance with the value of the address signal. Since the memory core can receive the address signal before the validation of a command, the circuit operation is performed at high speed even in the semiconductor integrated circuit including the plurality of memory cores are controlled as bank.

41 Claims, 21 Drawing Sheets

SEMICONDUCTOR INTEGRATED CIRCUIT AND METHOD OF OPERATING THE SAME

BACKGROUND OF THE INVENTION

1. Field of the Invention

The present invention relates to technology for heightening the operating speed of a semiconductor integrated circuit.

2. Description of the Related Art

Semiconductor integrated circuits have steadily heightened their operating speed owing to the progress of semiconductor manufacturing technology. In particular, the operating frequency of a logic LSI such as microcomputer has been yearly enhanced, and the difference thereof from the operating frequency of a memory LSI such as DRAM has been expanding.

In order to reduce such difference, there have been developed high-speed DRAMs of clock synchronous type such as SDRAM (Synchronous DRAM), RDRAM (Rambus DRAM) and SLDRAM (SyncLink DRAM).

The high-speed DRAM of this type is possible to read and write the data of sequential addresses at high speed by an input/output circuit operating in synchronization with a clock signal, and an extended internal bus. Therefore, the high-speed DRAMs are often employed for the main storages of personal computers and workstations.

Meanwhile, in the high-speed DRAM of this type, the operating speed of a memory core is almost the same as that of a conventional DRAM. Consequently, the data transfer of (random access to) not sequential addresses is not much faster as compared with the data transfer of the sequential addresses.

As a result, it is sometimes difficult to adopt the high-speed DRAM due to a low data transfer rate in a field such as image processing, where the random access occurs frequently.

However, a DRAM capable of random access at high speed has been demanded even in such field since the DRAM is less expensive than an SRAM.

SUMMARY OF THE INVENTION

An object of the present invention is to provide a semiconductor integrated circuit capable of shortening the time required for the operation of its internal circuit.

Another object of the present invention is to provide a semiconductor integrated circuit capable of shortening the time required for the operation of its internal circuit without increasing the power consumption.

Still another object of the present invention is to perform random access at high speed in a semiconductor integrated circuit having memory cells.

Yet another object of the present invention is to further heighten the speed of burst access in a semiconductor integrated circuit having memory cells.

A further object of the present invention is to operate at high speed a redundancy circuit which relieves defects in a memory core.

According to one of the aspects of a semiconductor integrated circuit in the present invention, a command receiving circuit receives a command signal which indicates an operation mode of an internal circuit, in synchronization with a clock signal and it outputs an internal command signal. An address switching circuit permits transmission of an address signal to an internal circuit upon receiving the command signal. The internal circuit (for example, address decoder) receives the address signal before receiving the command signal, thereby to start its operation. As a result, the internal circuit can be operated at high speed.

Besides, the address switching circuit inhibits the transmission of the address signal to the internal circuit upon receiving the internal command signal or the clock signal. Therefore, even when the level of the address signal has changed after the acceptance of the command signal, the change does not lead to operating the internal circuit. Accordingly, the power consumption is reduced.

According to another aspect of the semiconductor integrated circuit in the present invention, this circuit comprises a memory core which includes a plurality of memory cells and a word line connected to the memory cells and it has the function of a burst operation in which the memory cells connected to the same word line are continuously accessed. A burst address counter generates a burst address signal for performing the burst operation. A burst switching circuit permits the transmission of the burst address signal to the internal circuit upon receiving a command signal for performing the burst operation. The internal circuit receives the burst address signal before receiving the command signal, thereby to start its operation. Accordingly, the internal circuit can be operated at high speed even in the semiconductor integrated circuit which has the function of the burst operation.

Besides, the burst switching circuit inhibits the transmission of the burst address signal to the internal circuit upon receiving the internal command signal for performing the burst operation, or the clock signal. Therefore, even when the level of a burst address has changed due to noise or the like after the receipt of the command signal, the internal circuit does not malfunction.

According to another aspect of the semiconductor integrated circuit in the present invention, this circuit comprises a redundancy circuit for relieving defects in the memory core, and a redundancy comparator for comparing the address signal and a defect address. The redundancy comparator can make the comparison between the address signal and the defect address before receiving the command signal. Therefore, in a case where the received address signal corresponds to a defect part, the redundancy circuit is possible to start its operation before the validation of the command. The time required for the operation of the internal circuit can be shortened.

According to another aspect of the semiconductor integrated circuit in the present invention, the address signal necessary for the read operation or the write operation of the memory core is fed to the internal circuit before the validation of the command. Therefore, the read operation or the write operation is performed at high speed.

According to another aspect of the semiconductor integrated circuit in the present invention, the address signal is transmitted to the internal circuit before accepting the command signal for activating a word line. For instance, the decoding of the row address signal for activating the word line is started earlier. That is, a circuit corresponding to the row address signal is operated earlier, whereby a subsequent read operation or write operation is performed at high speed.

According to another aspect of the semiconductor integrated circuit in the present invention, a period during which the address switching circuit inhibits the transmission of the address signal is variable. The address signal fed anew during the inhibitory period is not transmitted to the internal circuit. Therefore, the unnecessary operations of the internal circuit are minimized and the power consumption is reduced.

According to another aspect of the semiconductor integrated circuit in the present invention, the inhibitory period is modified in accordance with, for example, the frequency of the clock signal, whereby the internal circuit is operated at the optimum timing suited for each frequency.

According to another aspect of the semiconductor integrated circuit in the present invention, the period during which the transmission of the address signal is inhibited, is set in accordance with the frequency of the clock signal supplied or the factor of the operation environment such as temperature, at the start of or during the circuit operation.

According to another aspect of the semiconductor integrated circuit in the present invention, the period during which the transmission of the address signal is inhibited, is optimally set in accordance with, for example, the frequency of the clock signal supplied, at the time of operating the circuit or mounting the semiconductor integrated circuit on its printed-wiring board.

According to another of the aspects of the semiconductor integrated circuit in the present invention, the period during which the transmission of the address signal is inhibited, is set by blowing out fuses in accordance with, for example, the maximum operating frequency evaluated with a probing test. In other words, the inhibitory period is set in accordance with the characteristics of the semiconductor integrated circuit as manufactured.

According to another aspect of the semiconductor integrated circuit in the present invention, a data read operation may well be performed in the sequence of the activation of a word line, the turning-on operation of a column switch and the activation of a sense amplifier. The data of a memory cell transmitted to bit lines by the activation of the word line can also be transmitted to an outputting circuit or the like through the column switch before the sense amplifier is activated. As a result, the read operation is performed at high speed.

According to another aspect of the semiconductor integrated circuit in the present invention, the redundancy comparator compares the address signal and the defect address irrespective of whether the memory core is selected or unselected. Therefore, the operation of the redundancy circuit is started earlier, resulting in shortening the time required for the operation of the internal circuit and performing the read or the write operation at high speed.

According to another aspect of the semiconductor integrated circuit in the present invention, the operation of the redundancy circuit is started earlier so that the time required for the operation of the internal circuit is shortened. Moreover, only the redundancy comparator corresponding to the selected memory core is operated so that the power consumption is reduced.

According to another aspect of the semiconductor integrated circuit in the present invention, this circuit comprises a plurality of memory cores, and a bank switch for selecting the memory cores. A command receiving circuit receives a command signal for indicating an operation of an internal circuit, in synchronization with a clock signal and it outputs an internal command signal. An address switching circuit permits transmission of an address signal to an internal circuit upon receiving the command signal. The bank switch feeds the address signal to predetermined memory core(s) of the memory cores in accordance with the value of the address signal transmitted through the address latching circuit. Since the memory core receives the address signal before the validation of a command, it is possible to shorten the time necessary for the operation circuit even in the semiconductor integrated circuit in which a plurality of memory cores are controlled as bank.

According to another aspect of the semiconductor integrated circuit in the present invention, the bank switch provided for each of the memory cores inhibits the transmission of the address signal during the operation of the corresponding memory core. Therefore, when the memory core starts its operation, it is possible to prevent the operation from malfunctioning due to the transmission of any address signal irrelevant to the operation. Not operating impertinent circuits reduces the current consumption.

According to another aspect of the semiconductor integrated circuit in the present invention, the address signal is not transmitted to the interior of the memory core which is not to be operated and hence, circuits such as a decoder and a redundancy circuit are not operated. Accordingly, the current consumption is further reduced.

According to another aspect of the semiconductor integrated circuit of the present invention, in synchronization with the clock signal, the first control signal is activated for a predetermined period and is inactivated for a predetermined period during one clock cycle. The external address signal supplied from the exterior is transmitted to the internal circuit when the first control signal is inactivated. The internal address signal generated by the address generating circuit is transmitted to the internal circuit when the first selecting signal is activated. That is, the external address signal is transmitted in asynchronization with the clock signal, and the internal address signal is transmitted in synchronization with the clock signal. Accordingly, during one clock cycle, both the external address signal and the internal address signal can be transmitted to the internal circuit in sequence.

Because the external address signal is transferred to the memory core in asynchronization with the clock signal, it is possible to reduce the read operation time and the write operation time of the memory cell dependent on the supply of the external address signal. As a result, the frequency of the clock signal can be increased, enabling high-speed operation of the semiconductor integrated circuit.

The external address signal and the internal address signal are transmitted to the memory core through the common signal line so that the number of signal lines can be reduced. The signal path from the input circuit to the memory core is generally long. Since an address signal is constructed of a plurality of bits, the required number of signal lines is large. Accordingly, a reduction in the number of signal lines considerably contributes to a reduction in chip size.

According to another aspect of the semiconductor integrated circuit of the present invention, the internal address signal generated in synchronization with the clock signal is transmitted when the first control signal which is activated in synchronization with the clock signal, is activated. Accordingly, the selecting operation of the internal address signal by the first switching circuit is performed with readiness and reliability. This makes it possible to increase a timing margin required for selecting the external address signal in the first switching circuit.

According to another aspect of the semiconductor integrated circuit of the present invention, the first accepting signal is activated in asynchronization with the clock signal and is inactivated in synchronization with the clock signal. That is, the first accepting signal is activated corresponding to the inactivation period of the first control signal. The second accepting signal is activated corresponding to the activation period of the first control signal so that the first holding circuit can accept the external address signal among the address signals transmitted through the signal line in accordance with the first accepting signal. The second holding circuit can accept the internal address signal among the address signals transmitted through the signal line in accordance with the second accepting signal. This results in reliably separating the external address signal and the internal address signal transmitted through the common signal line.

According to another aspect of the semiconductor integrated circuit of the present invention, because the activation periods of the first accepting signal and the second accepting signal do not overlap with each other, the external address signal and the internal address signal are reliably held in the first and second holding circuits, respectively.

According to another aspect of the semiconductor integrated circuit of the present invention, the second control signal is activated in response to the command signal supplied in asynchronization with the clock signal for a predetermined period. The second switching circuit selects the external address signal held in the first holding circuit when the second control signal is activated and selects the internal address signal held in the second holding circuit when the second control signal is inactivated. That is, the external address signal can be selected in asynchronization with the clock signal and the internal address signal can be selected in synchronization with the clock signal even in circuit operations in the side of the memory core corresponding to those in the side of the input circuit.

According to another aspect of the semiconductor integrated circuit of the present invention, the internal address signal is used as a burst address signal. The burst address signal is an address signal for use in a burst operation in which memory cells connected to the same word line are continuously accessed. The external address signal is initially supplied to a memory core and then a predetermined number of internal address signals is supplied to the memory core in sequence. The internal address signals are generated based on the external address signal. Accordingly, an internal address signal can be generated prior to a clock cycle where the internal address signal are used. Such an earlier generation of internal address signals is advantageous for shortening read operation time and write operation time. However, in case the generating timing of the internal address signals is too early with respect to the activation timing of the column switches, the internal address signal to be used for the next clock cycle will be accepted by the decoder. Because of this, erroneous operations may occur due to the activation of a column switch other than the one to be activated. It is possible to prevent the occurrence of such erroneous operations by changing the transmission timing of the internal address signal supplied to the second switching circuit in accordance with the activation timing of the column switches.

According to another aspect of the semiconductor integrated circuit of the present invention, the transition edge of the external address signal is transmitted to the decoder of a memory core in asynchronization with the clock signal. Accordingly, the read operation time and the write operation time of the memory cells dependent on the supply of the external address signal can be shortened. This results in increasing the frequency of the clock signal, allowing high-speed operation of the semiconductor integrated circuit.

According to one of the aspects of a method of operating a semiconductor integrated circuit in the present invention, transmission of an address signal to an internal circuit is permitted before receiving a command signal for indicating an operation mode of an internal circuit, in synchronization with a clock signal. The internal circuit (for example, address decoder) receives the address signal before receiving the command signal, thereby to start its operation. As a result, the internal circuit can be operated at high speed. Besides, the transmission of the received address signal to the internal circuit is inhibited after the command signal has been received. Therefore, even when the level of the address signal has changed after the reception of the command signal, the change does not lead to operating the internal circuit. Accordingly, the power consumption is reduced.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Now, the embodiments of the present invention will be described with reference to the drawings.

Figure 1:
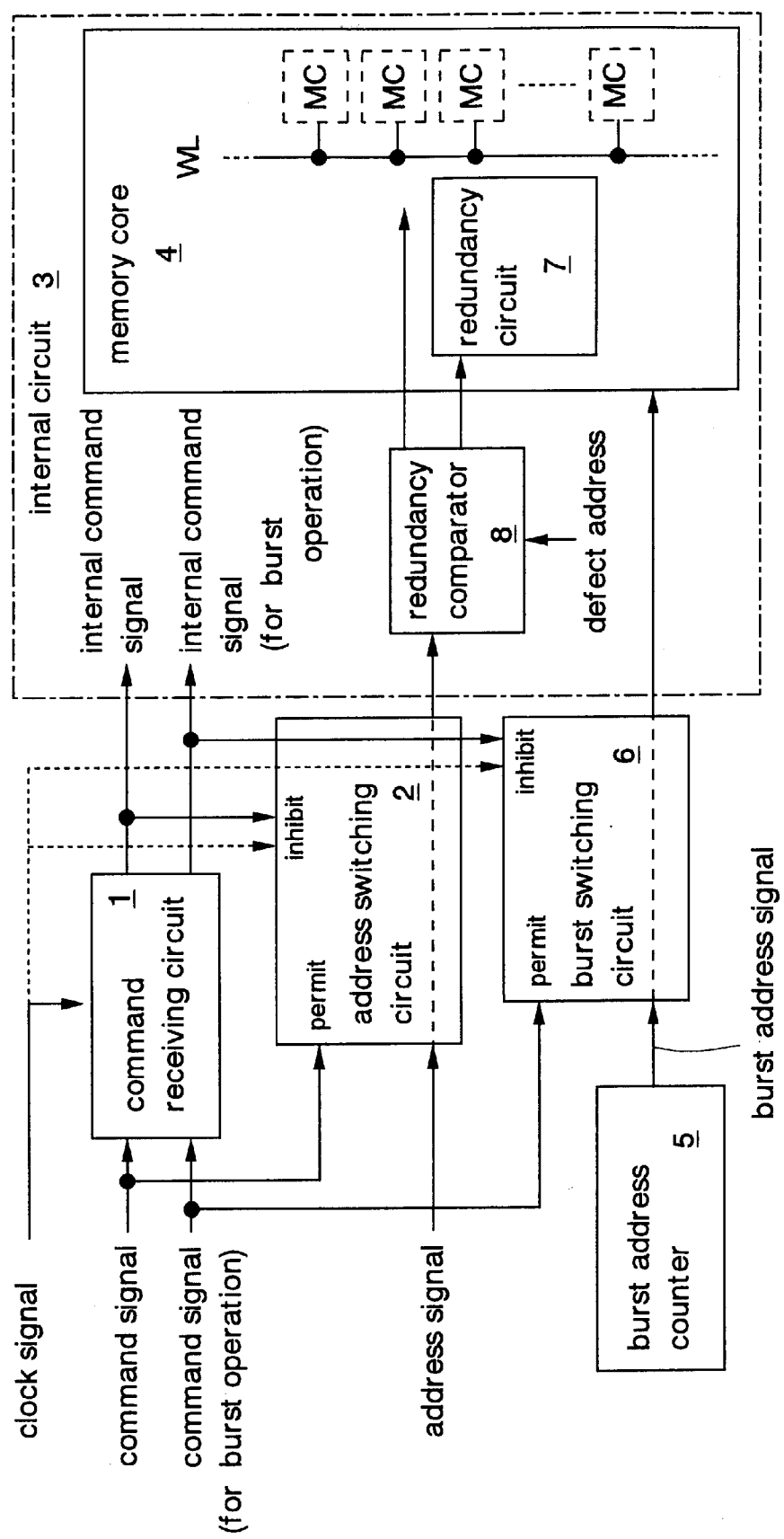
FIG. 1 is a block diagram showing the basic principle of the present invention.
Figure 2:
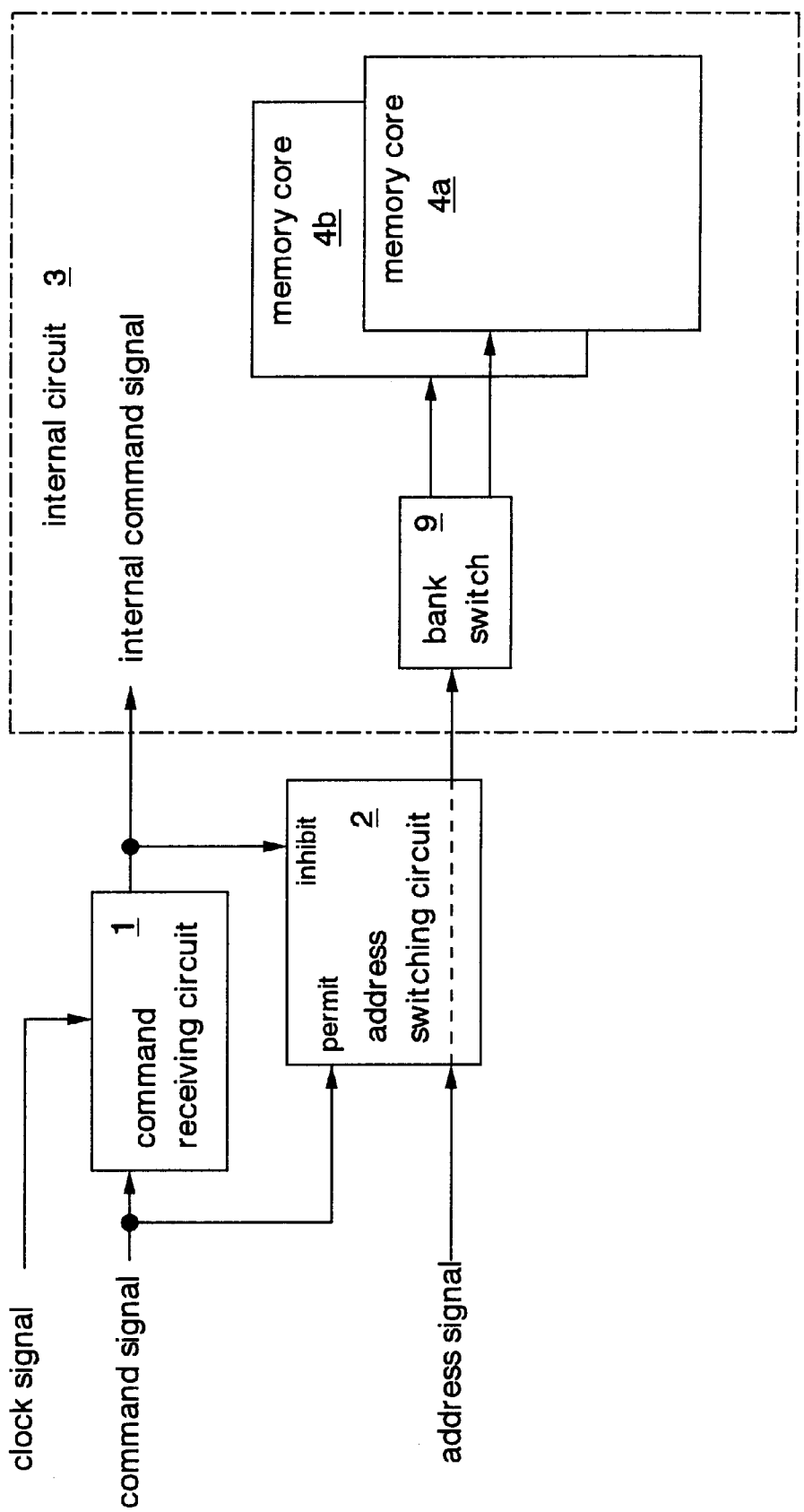
FIG. 2 is another block diagram showing the basic principle of the present invention.

FIGS. 1 and 2 are block diagrams each showing the basic principle of the present invention.

Referring to FIG. 1, a command receiving circuit 1 accepts a command signal for determining a circuit operation, in synchronization with a clock signal and it outputs the accepted command signal as an internal command signal. An address switching circuit 2 permits the transmission of an address signal to an internal circuit 3 upon receiving the outputted command signal. The internal circuit (for example, address decoder) 3 receives the address signal before accepting the command signal, thereby to start its operation.

In addition, the semiconductor integrated circuit of the present invention includes a memory core 4 which has a plurality of memory cells MC, and a word line WL connected to the memory cells MC. This semiconductor integrated circuit has the function of a burst operation in which the memory cells MC connected to the word line WL are continuously (in sequence or interleave) accessed. A burst address counter 5 generates a burst address signal for the burst operation. A burst switching circuit 6 permits the transmission of the burst address signal to the internal circuit 3 upon receiving a command signal for the burst operation. The internal circuit 3 receives the burst address signal before accepting the command signal, thereby to start its operation. Besides, the burst switching circuit 6 inhibits the transmission of the burst address signal to the internal circuit 3 upon receiving an internal command signal for the burst operation or the clock signal.

The internal circuit 3 includes a redundancy circuit 7 for relieving any defect in the memory core 4, and a redundancy comparator 8 for comparing the address signal and a defect address. The redundancy comparator 8 makes the comparison between the address signal and the defect address before accepting the command signal.

Referring to FIG. 2, the semiconductor integrated circuit of the present invention includes a plurality of memory cores 4a, 4b, and a bank switch 9 for selecting the memory cores 4a, 4b. A command receiving circuit 1 accepts a command signal for determining a circuit operation, in synchronization with a clock signal and it outputs the accepted command signal as an internal command signal. An address switching circuit 2 permits the transmission of an address signal to an internal circuit 3 upon receiving the command signal. The bank switch 9 supplies the address signal to the predetermined one of the memory cores 4a, 4b in accordance with the value of this address signal which is transmitted thereto through the address latching circuit 2.

Figure 3:
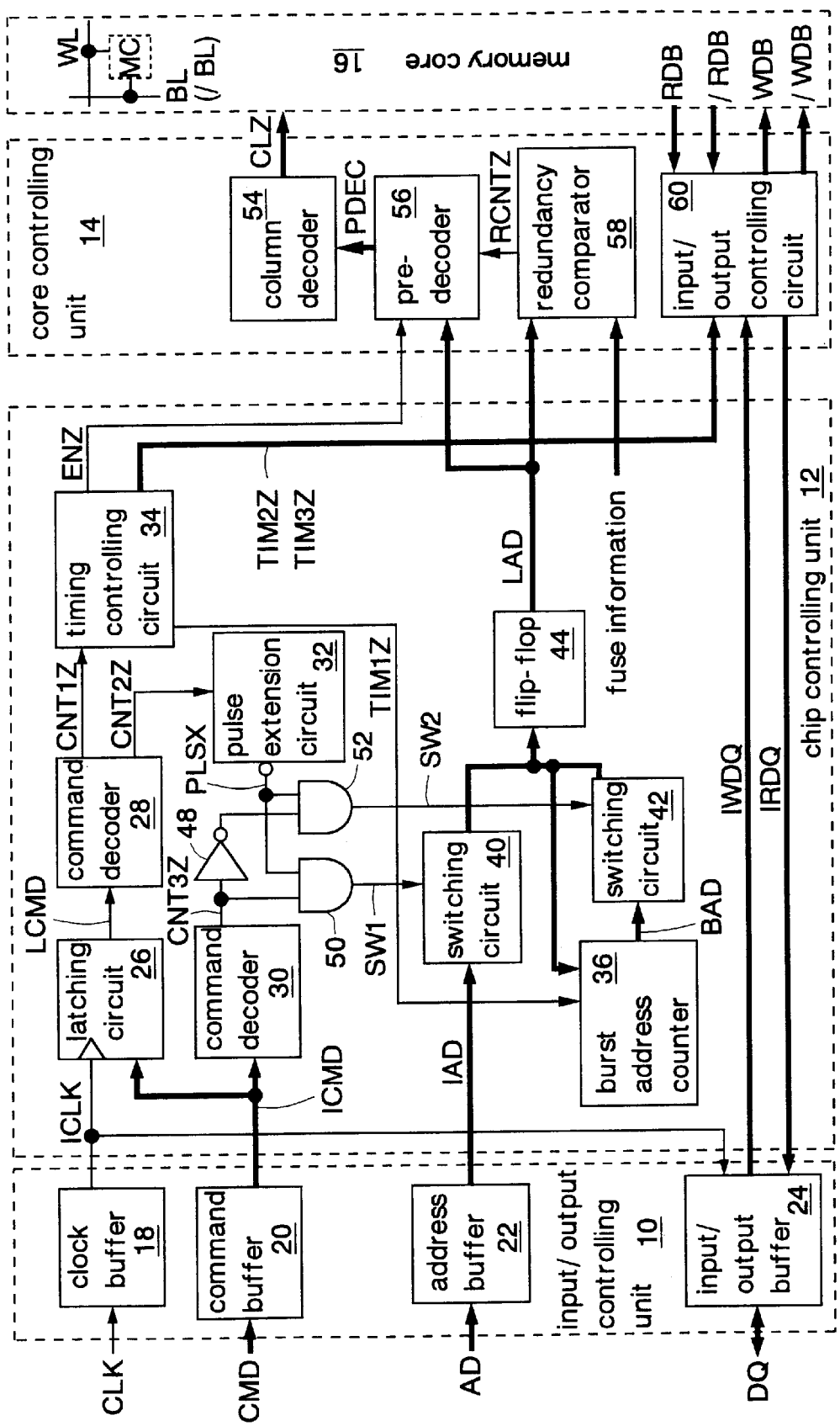
FIG. 3 is a block diagram showing the first embodiment of a semiconductor integrated circuit and a controlling method of the same the present invention.

FIG. 3 shows the first embodiment of the semiconductor integrated circuit and a controlling method of the same in the present invention.

The semiconductor integrated circuit of this embodiment is formed as an SDRAM on a silicon substrate by the use of CMOS process technology. In each of the drawings, a signal line indicated by a bold line is composed of a plurality of lines. Each of some blocks to which the bold signal lines are connected is composed of a plurality of circuits. A signal bearing letter "Z" at its tail is a signal of positive logic (which is activated at high level). On the other hand, a signal bearing letter "X" at its tail and a signal bearing symbol "/" at its head are signals of negative logic.

The semiconductor integrated circuit includes an input/output controlling unit 10, a chip controlling unit 12, a core controlling unit 14 and a memory core 16.

The input/output controlling unit 10 includes a clock buffer 18, a command buffer 20, an address buffer 22 and an input/output buffer 24.

The clock buffer 18 receives a clock signal CLK and outputs the received signal as an internal clock signal ICLK. The command buffer 20 receives a command signal CMD and outputs the received signal as an internal command signal ICMD. The address buffer 22 receives an address signal AD and outputs the received signal as an internal address signal IAD. Here, the command signal CMD and address signal AD which are respectively fed to the command buffer 20 and the address buffer 22 are transmitted to the chip controlling unit 12 without being controlled by the internal clock signal ICLK.

In a write operation, the input/output buffer 24 receives a data signal DQ in synchronization with the clock signal CLK and outputs the received signal as an internal write data signal IWDQ. Besides, in a read operation, the input/output buffer 24 receives an internal read data signal IRDQ and outputs the received signal as a data signal DQ in synchronization with the clock signal CLK.

The chip controlling unit 12 includes a latching circuit 26, command decoders 28, 30, a pulse extension circuit 32, a timing controlling circuit 34, a burst address counter 36, switching circuits 40, 42, a flip-flop circuit 44, an inverter 48, and AND gates 50, 52. The latching circuit 26 corresponds to the command receiving circuit 1 shown in FIG. 1. The circuits of the command decoder 28, the timing controlling circuit 34, the flip-flop circuit 44, and a core controlling unit 14 to be explained later, correspond to the internal circuit 3 shown in FIG. 1. The switching circuit 40 corresponds to the address switching circuit 2 shown in FIG. 1. The switching circuit 42 corresponds to the burst switching circuit 6 shown in FIG. 1. The burst address counter 36, switching circuits 40, 42, and flip-flop circuit 44 operate corresponding to column addresses. The chip controlling unit 12 includes, other than the illustrated circuits, circuits which operate corresponding to row addresses.

The latching circuit 26 receives the internal command signal ICMD in synchronization with the internal clock signal ICLK, and outputs the received signal as a latched command signal LCMD.

The command decoder 28 receives the latched command signal LCMD and decodes a command, thereby to output control signals CNT1Z, CNT2Z which control the read operation and the write operation.

The command decoder 30 receives the internal command signal ICMD and decodes a command, thereby to output a control signal CNT3Z which controls the read operation and the write operation.

The timing controlling circuit 34 receives the control signal CNT1Z, and outputs timing signals TIM1Z, TIM2Z, TIM3Z and an enable signal ENZ. The timing signal TIM1Z is activated in the burst operation. The timing signal TIM2Z is activated in the read operation. The timing signal TIM3Z is activated in the write operation. The enable signal ENZ is activated in the read and the write operations.

The pulse extension circuit 32 extends the high-level period of the control signal CNT2Z and outputs the inverted signal of the extended signal as a pulse signal PLSX.

The AND gate 50 activates a switching signal SW1 when the control signal CNT3Z and the pulse signal PLSX are both at the high level. Likewise, the AND gate 52 activates a switching signal SW2 when the inverted signal of the control signal CNT3Z and the pulse signal PLSX are both at the high level. The inverter 48 inverts the control signal CNT3Z.

The burst address counter 36 receives the timing signal TIM1Z from the timing controlling circuit 34 and the internal address signal IAD from the switching circuit 40, and outputs burst addresses BAD in succession.

The switching circuit 40 is turned on in accordance with the activation of the switching signal SW1, thereby to transmit the internal address signal IAD to the flip-flop circuit 44. On the other hand, the switching circuit 42 is turned on in accordance with the activation of the switching signal SW2, thereby to transmit the burst address BAD to the flip-flop circuit 44.

The flip-flop circuit 44 latches the internal address signal IAD or the burst address BAD, and outputs the latched signal to the core controlling unit 14 as a latched address signal LAD.

The core controlling unit 14 includes a column decoder 54, a predecoder 56, a redundancy comparator 58 and an input/output controlling circuit 60.

The redundancy comparator 58 compares the latched address signal LAD with fuse information and it outputs a redundancy controlling signal RCNTZ when having decided the latched address signal LAD as a relief address. The relief address is a defect address which has been relieved by a redundancy circuit (not shown). Incidentally, the fuse information is obtained on the chip in correspondence with the presence or absence of the blowout of relieving fuses (not shown) formed on the chip. The fuses are blown out in accordance with the defect addresses found out in a probing test. The fuse information corresponds to the defect address indicated in FIG. 1.

The predecoder 56 receives the latched address signal LAD, the enable signal ENZ and the redundancy controlling signal RCNTZ and outputs a predecoding signal PDEC.

The column decoder 54 receives the predecoding signal PDEC, generates a column selecting signal CLZ, and outputs the generated signal to the memory core 16.

In the write operation, the input/output controlling circuit 60 accepts the internal write data signal IWDQ in synchronization with the timing signal TIM2Z and outputs write data signals WDB, /WDB. Besides, in the read operation, the input/output controlling circuit 60 accepts read data signals RDB, /RDB in synchronization with the timing signal TIM3Z and outputs the internal read data signal IRDQ.

The memory core 16 includes a plurality of memory cells MC connected to a word line WL and a bit line BL (/BL). Each of the memory cells MC is constituted by a capacitor not shown and a transfer MOS whose gate has the word line WL connected thereto. Parts of such word lines WL, bit lines BL (/BL) and memory cells MC are used as the redundancy circuit 7 shown in FIG. 1.

Figure 4:
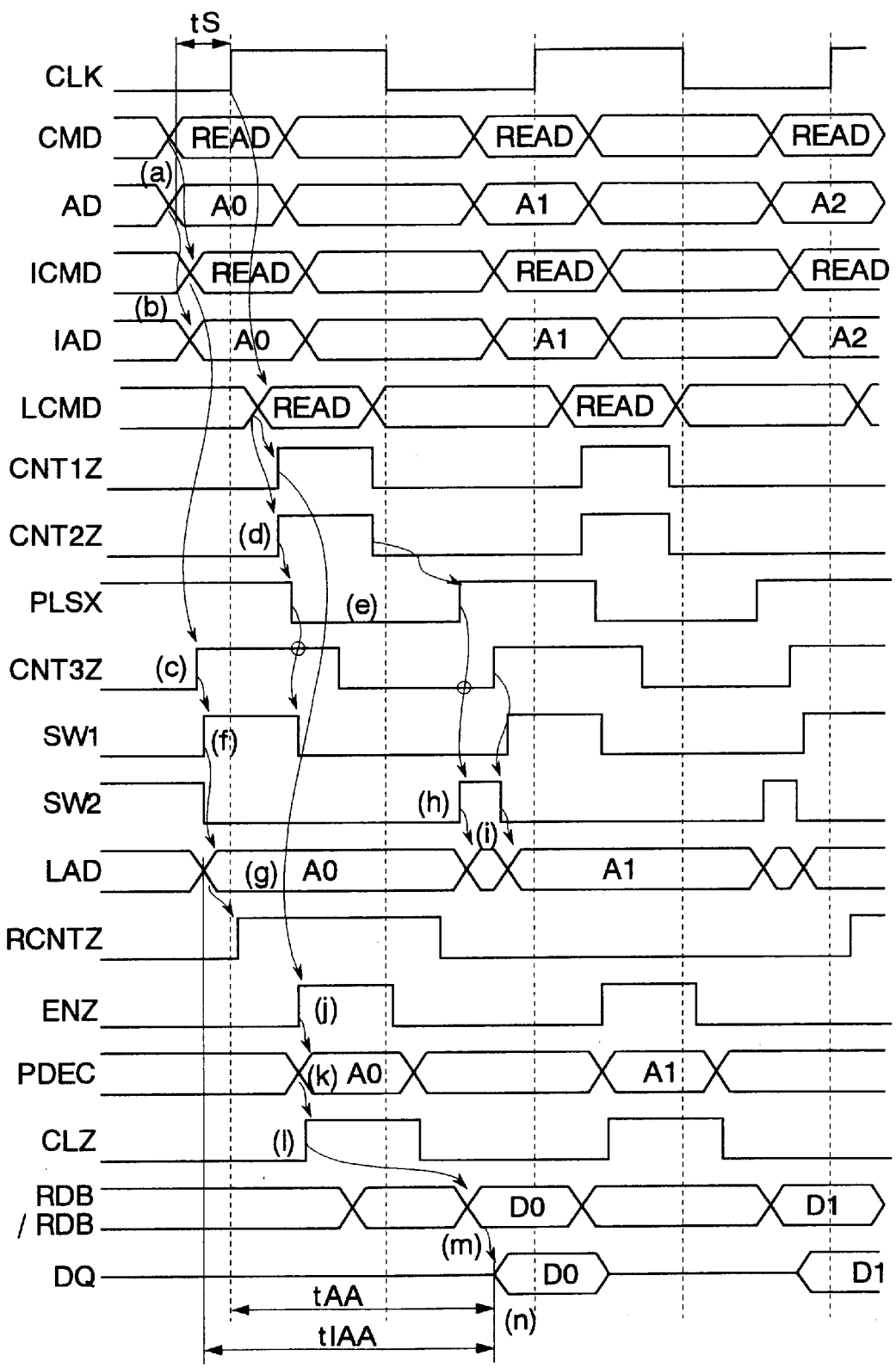
FIG. 4 is a timing chart showing a read operation in the first embodiment.

FIG. 4 shows the timings of the principal signals of the read operation in the semiconductor integrated circuit explained above. Incidentally, the write operation is also performed at timings similar to the timings stated below, except the input/output control of data.

First, the command signal CMD (READ) and the address signal AD (A0) are respectively fed to the command buffer 20 and address buffer 22 shown in FIG. 3 (FIG. 4(a)). Here, the command signal CMD and the address signal AD are fed, at least, a set-up time tS earlier than the rise of the clock signal CLK. The set-up time tS is the minimum period in which the input signal must be validated before the rise of the clock signal CLK.

The command buffer 20 and address buffer 22 receive the command signal CMD and address signal AD, and they output the received signals as the internal command signal ICMD and internal address signal IAD, respectively (FIG. 4(b)).

The command decoder 30 decodes the internal command signal ICMD and outputs the control signal CNT3Z (FIG. 4(c)). The command decoder 30 operates asynchronously to the clock signal CLK, and is therefore capable of outputting the control signal CNT3Z before the rising edge of the clock signal CLK.

The latching circuit 26 accepts the internal command signal ICMD in synchronization with the rising edge of the internal clock signal ICLK, and outputs the accepted signal as the latched command signal LCMD (READ). Subsequently, the command decoder 28 decodes the latched command signal LCMD and outputs the control signals CNT1Z, CNT2Z (FIG. 4(d)).

The pulse extension circuit 32 extends the high-level period of the control signal CNT2Z and outputs the inverted signal of the extended signal as the pulse signal PLSX (FIG. 4(e)).

The AND gate 50 activates the switching signal SW1 during a period during which the control signal CNT3Z and the pulse signal PLSX are both at the high level (FIG. 4(f)).

The switching circuit 40 turns on its switch in accordance with the activation of the switching signal SW1, thereby to transmit the internal address signal IAD to the flip-flop circuit 44. That is, the transmission of the address signal AD to the internal circuit is permitted upon receiving the command signal CMD, whereas it is inhibited upon receiving the latched command signal LCMD.

The flip-flop circuit 44 accepts the internal address signal IAD, and outputs the accepted signal as the latched address signal LAD (A0) (FIG. 4(g)). That is, the core controlling unit 14 is capable of receiving the latched address signal LAD before or immediately after the rise of the clock signal CLK. As a result, the circuit operation is started earlier.

Incidentally, the AND gate 52 activates the switching signal SW2 during a period for which the control signal CNT3Z is at low level, and the pulse signal PLSX is at the high level (FIG. 4(h)). The switching circuit 42 turns on its switch in accordance with the activation of the switching signal SW2, thereby to transmit the burst address signal BAD to the flip-flop circuit 44 (FIG. 4(i)). The flip-flop circuit 44 accepts the burst address signal BAD and outputs the accepted signal as the latched address signal LAD. However, the enable signal ENZ is at low level at this state so that the predecoder 56 does not operate.

The redundancy comparator 58 compares the latched address signal LAD with the fuse information and it outputs the relief controlling signal RCNTZ when the latched address signal LAD is the address to be relieved. Here, the presence or absence of the relief is decided by using the internal address signal IAD fed before the rise of the clock signal CLK. Accordingly, it is possible to decide whether or not the address signal AD coincides with the relief address earlier than it is in the prior art.

The timing controlling circuit 34 receives the control signal CNT1Z and outputs the enable signal ENZ and the timing signal TIM2Z (FIG. 4(*j*)). The timing signal TIM3Z is not outputted in the read operation.

The predecoder 56 receives the latched address signal LAD and relief controlling signal RCNTZ, and outputs the predecoding signal PDEC (A0) in synchronization with the enable signal ENZ (FIG. 4(*k*)). Here, the predecoder 56 can receive the latched address signal LAD and relief controlling signal RCNTZ earlier than in the prior art. It is therefore possible to output the enable signal ENZ earlier.

Subsequently, the column decoder 54 receives the predecoding signal PDEC and outputs the column selecting signal CLZ (FIG. 4(*l*)). Besides, the data of the memory cell MC corresponding to the address signal AD is outputted as the read data signals RDB, /RDB (D0) (FIG. 4(*m*)).

The input/output controlling circuit 60 transmits the read data signals RDB, /RDB to the input/output buffer 24 as the internal read data signal IRDQ. The input/output buffer 24 outputs the received internal read data signal IRDQ as the data signal DQ (D0) in synchronization with the rise of the internal clock signal ICLK (FIG. 4(*n*)). Then, the read operation for the address signal AD (A0) is completed.

In this example, an internal address access time tIAA is a period from the inputting of the latched address signal LAD to the predecoder 56, to the outputting of the data signal DQ, may include a period preceding the rise of the clock signal CLK. As a result, an address access time tAA, which is a period from the validation of the address signal AD to the outputting of the data signal DQ (operation specification), is shortened by substantially the set-up time tS as compared with a corresponding time in the prior art. That is, the read operation is performed at high speed. In particular, a period necessary for the redundancy comparison is shifted to the front of a read cycle so that the effect is remarkable in the case that the address signal AD coincides with the relief address.

Figure 5:
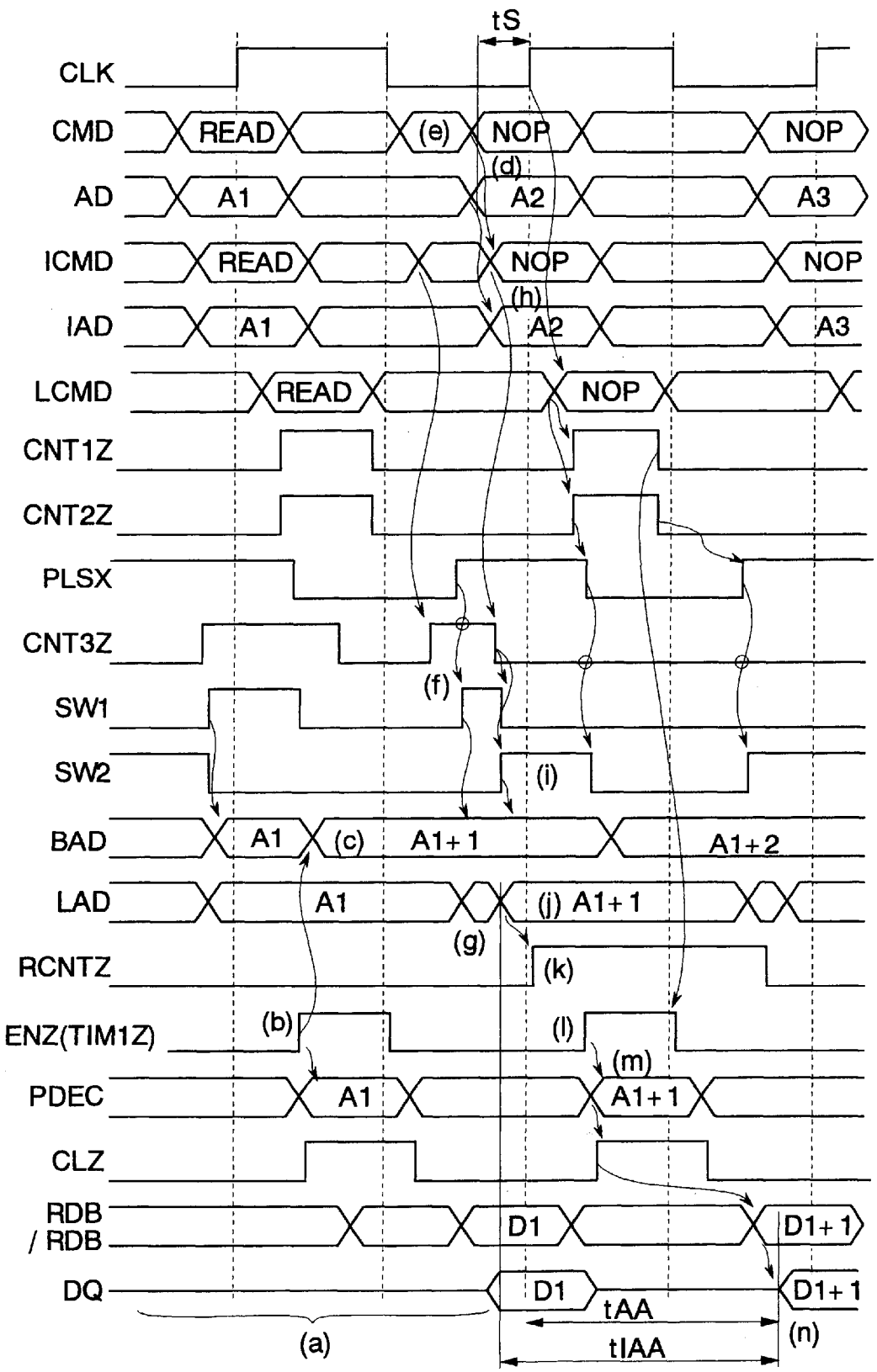
FIG. 5 is a timing chart showing a burst read operation in the first embodiment.

FIG. 5 shows the timings of the principal signals of the burst read operation in the semiconductor integrated circuit explained above. Incidentally, the burst write operation is also performed at timings similar to the timings stated below, except the input/output control of data.

The burst read operation is performed upon receiving any command different from a read command and a write command, after the read command. In this embodiment, the semiconductor integrated circuit performs the burst read operation upon receiving an NOP (No Operation) command after the read command.

First, the command signal CMD (READ) and the address signal AD (A1) are fed, and the read operation is performed at the same timings as in FIG. 4 (FIG. 5(*a*)). By the way, in this read operation, the address signal AD (A1) does not indicate a defect address. Therefore, the relief controlling signal RCNTZ is not activated.

The timing controlling circuit 34 shown in FIG. 3 outputs the timing signal TIM1Z of substantially the same timing as that of the enable signal ENZ when it has accepted the READ command (FIG. 5(*b*)). The burst address counter 36 accepts as a counter value the internal address signal IAD (A1) received from the switching circuit 40, increments the counter value by 1 in synchronization with the timing signal TIM1Z and outputs the resulting counter value as the burst address signal BAD (A1+1) (FIG. 5(*c*)). Since the switching signal SW2 is at low level at this state, the switching circuit 42 does not output the burst address BAD.

Subsequently, the command signal CMD (NOP) and the address signal AD are respectively fed to the command buffer 20 and address buffer 22 (FIG. 5(*d*)). When the invalid command signal CMD is fed before the feed of the NOP command (FIG. 5(*e*)), the control signal CNT3Z and the switching signal SW1 are activated (FIG. 5(*f*)). In accordance with the activation of the switching signal SW1, the flip-flop circuit 44 latches the internal address signal IAD and outputs the latched signal as the latched address signal LAD (FIG. 5(*g*)). However, the predecoder 56 does not operate because of the low level of the enable signal ENZ. That is, even when the command buffer 20 has received any command signal (including noise) asynchronous to the rise of the clock signal CLK, neither of the core controlling unit 14 or the memory core 16 malfunctions.

The command buffer 20 and address buffer 22 receive the command signal CMD (NOP) and address signal AD (A2), and they output the received signals as the internal command signal ICMD and internal address signal IAD, respectively (FIG. 5(*h*)). Here, the switching circuit 40 is disabled so that the address signal IAD (A2) is not transmitted to the interior.

The AND gate 52 activates the switching signal SW2 during a period for which the control signal CNT3Z is at the low level, and besides, the pulse signal PLSX is at the high level (FIG. 5(*i*)). That is, the transmission of the burst address signal BAD to the internal circuit is permitted upon receiving the command signal CMD, whereas it is inhibited upon receiving the internal command signal ICMD.

The switching circuit 42 outputs the burst address signal BAD (A1+1) in accordance with the activation of the switching signal SW2.

Subsequently, the flip-flop circuit 44 accepts the burst address signal BAD and outputs the accepted signal as the latched address signal LAD (A1+1) (FIG. 5(*j*)).

The redundancy comparator 58 compares the latched address signal LAD with the fuse information, and it outputs the relief controlling signal RCNTZ when the latched address signal LAD is the address to be relieved (FIG. 5(*k*)). Also in the burst read operation, it is possible to decide whether or not the burst address signal BAD coincides with the relief address earlier than it is in the prior art.

The timing controlling circuit 34 receives the control signal CNT1Z, and outputs the enable signal ENZ and the timing signal TIM2Z (FIG. 5(*l*)).

The predecoder 56 receives the latched address signal LAD and the relief controlling signal RCNTZ and outputs the predecoding signal PDEC in synchronization with the enable signal ENZ (FIG. 5(*m*)). Also in the burst read operation, the predecoder 56 can receive the latched address signal LAD and the relief controlling signal RCNTZ earlier than in the prior art. It is consequently possible to output the enable signal ENZ earlier.

Subsequently, the column selecting signal CLZ is outputted at the same timing as in the read operation, and the data of the memory cell MC corresponding to the burst address signal BAD is read out (FIG. 5(*n*)). Thereafter, the read operations of data corresponding to a burst length which is set in a mode register (not shown) or the like are performed by receiving the NOP commands in succession.

In this example, an internal address access time tIAA which is a period from the inputting of the latched address signal LAD to the predecoder 56, to the outputting of the data signal DQ, can include a period preceding the rise of the clock signal CLK. As a result, an address access time tAA in the burst mode, which is an a period from the rise of the clock signal CLK to the outputting of the data signal DQ (operation specification), is shortened by substantially the set-up time tS as compared with a corresponding time in the prior art. That is, the burst read operation can be performed at high speed. In particular, a period necessary for the redundancy comparison can be shifted to the front of a read cycle so that the effect is remarkable in the case of the burst address signal BAD coinciding with the relief address.

As described above, according to the semiconductor integrated circuit and the controlling method of the same in the present invention, the switching circuit 40 permits the transmission of the address signal AD to the core controlling unit 14 upon receiving the command signal CMD (READ). Therefore, the operation of the predecoder 56 can be started earlier, and the data read and write operations are performed at high speed. In addition, the switching circuit 40 inhibits the transmission of the address signal AD to the core controlling unit 14 upon receiving the latched command signal LCMD. Therefore, the predecoder 56 can be prevented from malfunctioning due to the address signal AD erroneously fed by noise or the like. As a result, the power consumption can be reduced.

On the other hand, the switching circuit 42 permits the transmission of the burst address signal BAD to the core controlling unit 14 upon receiving the command signal CMD (NOP). Also in the burst operation, therefore, the operation of the predecoder 56 can be started earlier, and the data read and write operations can be performed at high speed. In addition, the switching circuit 42 inhibits the transmission of the burst address signal BAD to the core controlling unit 14 upon receiving the latched command signal LCMD. Therefore, the predecoder 56 can be prevented from malfunctioning even when the burst address BAD has changed due to noise or the like.

The redundancy comparator 58 can compare the latched address signal LAD and the fuse information earlier. Accordingly, in the case where the received address signal AD indicates the defect address, the operation of the redundancy circuit can be started before the validation of the command, and the read and write operations can be performed at high speed.

Figure 6:
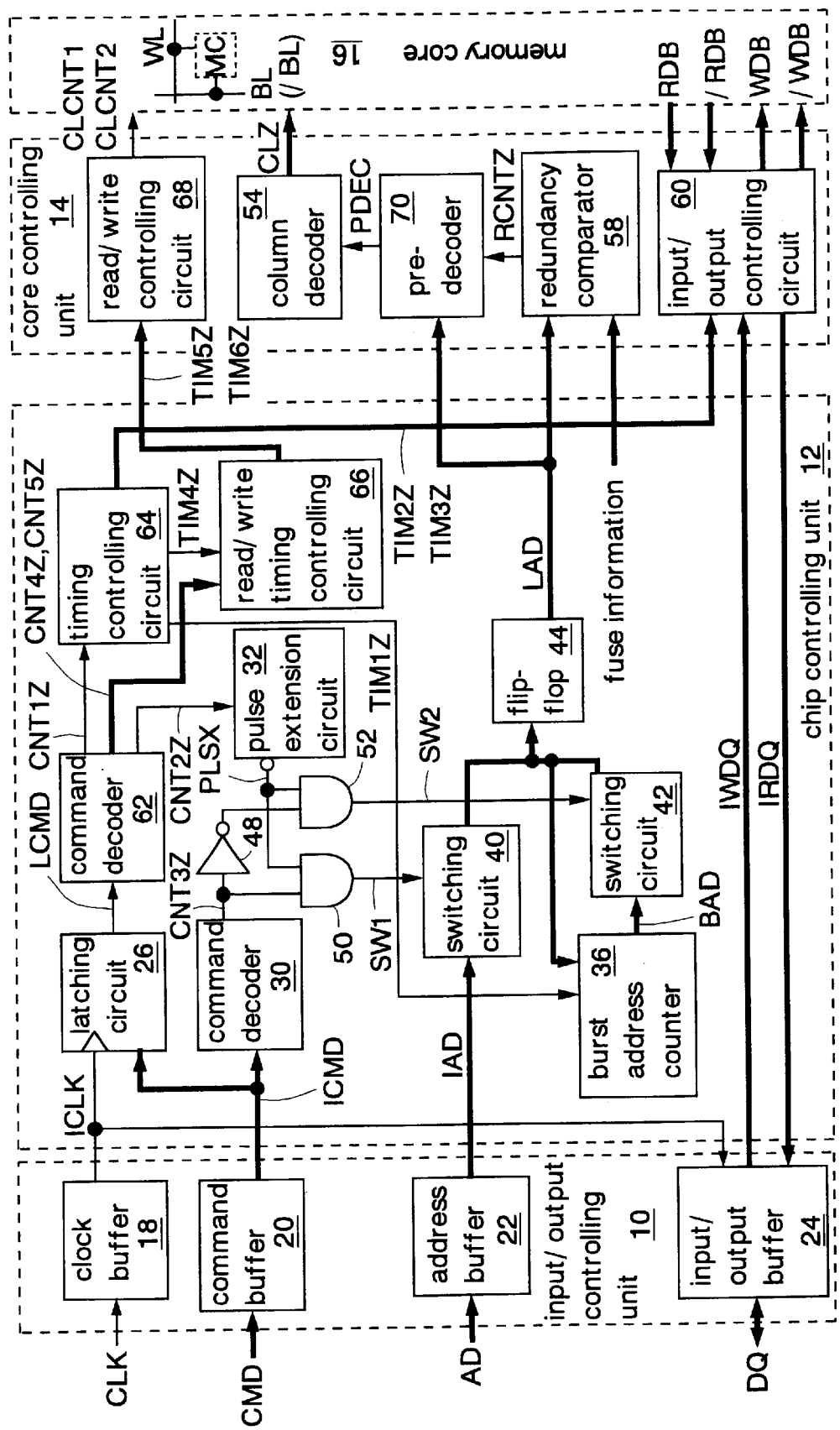
FIG. 6 is a block diagram showing the second embodiment of the semiconductor integrated circuit in the present invention.

FIG. 6 shows the second embodiment of the semiconductor integrated circuit and the controlling method of the same in the present invention. The same components as in the first embodiment are indicated by identical reference numerals and the detailed description thereof shall be omitted here.

In this embodiment, the command decoder 62 and timing controlling circuit 64 in a chip controlling unit 12, and the predecoder 70 of a core controlling unit 14 respectively differ from the command decoder 28, timing controlling circuit 34 and predecoder 56 in the first embodiment. Besides, the chip controlling unit 12 is additionally provided with a read/write timing controlling circuit 66, while the core controlling unit 14 is additionally provided with a read/write controlling circuit 68. The remaining construction is the same as in the first embodiment.

The command decoder 62 outputs a control signal CNT4Z in a read operation, and outputs a control signal CNT5Z in a write operation. The timing controlling circuit 64 outputs a timing signal TIM4Z. The timing controlling circuit 64 does not output the enable signal ENZ in the first embodiment.

The read/write timing controlling circuit 66 receives the control signal CNT4Z and outputs a timing signal TIM5Z in the read operation, while it receives the control signal CNT5Z and outputs a timing signal TIM6Z in the write operation.

The read/write controlling circuit 68 receives the timing signal TIM5Z (or TIM6Z), and outputs a column line controlling signal CLCNT1 (or CLCNT2) to a memory core 16.

The predecoder 70 does not include a controlling circuit which receives the enable signal ENZ in the first embodiment.

Figure 7:
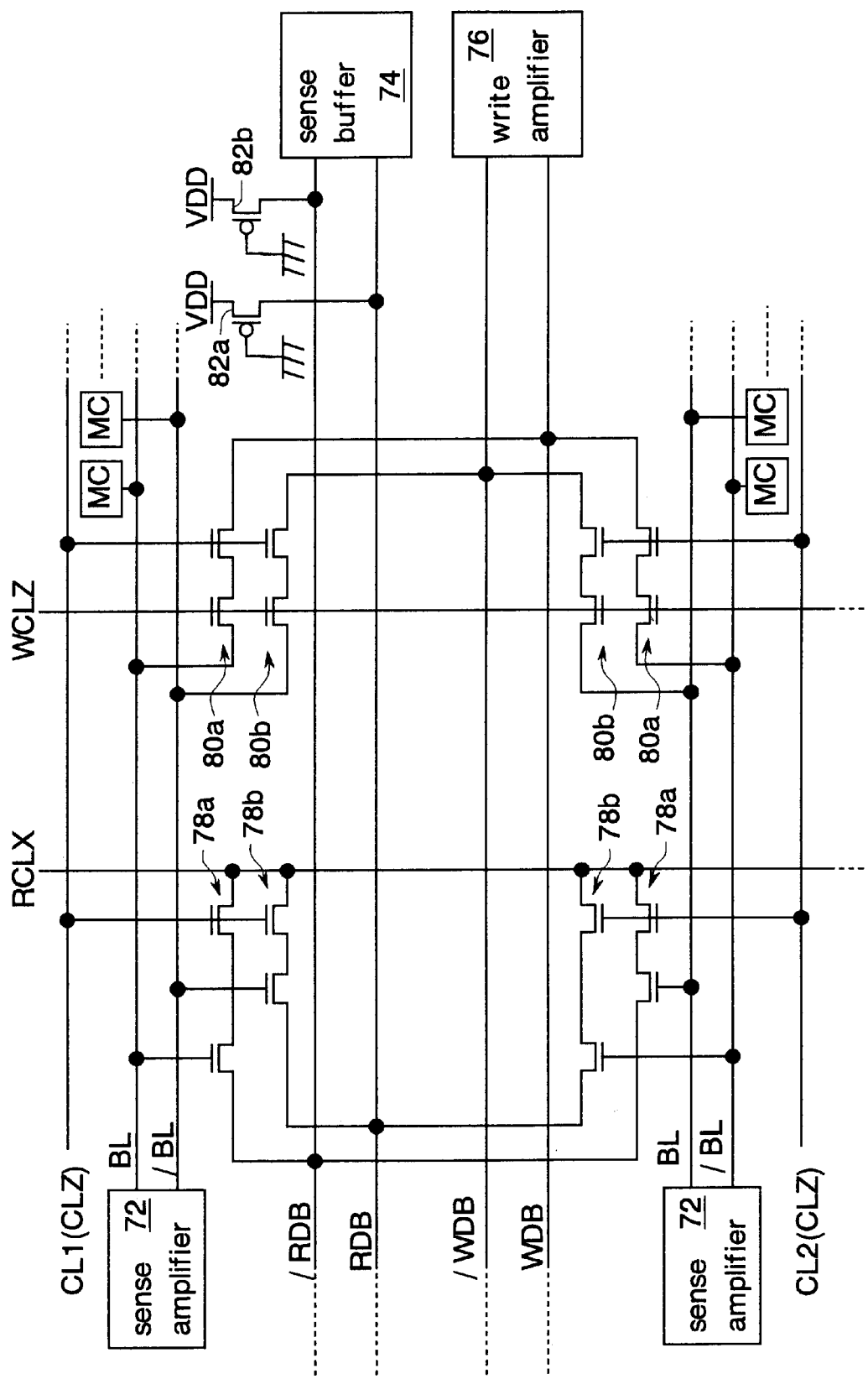
FIG. 7 is a circuit diagram showing the essential portions of a memory core shown in FIG. 6.

FIG. 7 shows the essential portions of the memory core 16.

The memory core 16 includes memory cells MC, sense amplifiers 72, a sense buffer 74, a write amplifier 76, reading column switches 78a, 78b, writing column switches 80a, 80b, and PMOS 82a, 82b for pulling up read data signals RDB, /RDB. Each of the column switches 78a, 78b or 80a, 80b is composed of two nMOS which are connected in series.

The sense amplifier 72 is connected to the memory cells MC through bit lines BL, /BL. The signal lines of the read data signals RDB, /RDB are connected to the sense buffer 74, while those of write data signals WDB, /WDB are connected to the write amplifier 76.

The column switch 78a receives a read controlling signal RCLX at one end and it outputs the read data signal /RDB from the other end. The gate of the nMOS on the one-end side of the column switch 78a is connected to a column selecting signal CL1 (or CL2). The column selecting signals CL1, CL2 correspond to a column selecting signal CLZ shown in FIG. 6. The gate of the nMOS on the other-end side of the column switch 78a is connected to the bit line BL.

The column switch 78b is the same as the column switch 78a except that the read data signal RDB is outputted from the other end thereof and that the gate of the nMOS on the other-end side thereof is connected to the bit line /BL.

A system in which the gates in the column switches 78a, 78b are controlled by the voltages of the bit lines BL, /BL, is called the "direct sense system". In the direct sense system, the signal lines of the read data signals RDB, /RDB are not directly outputted from the bit lines BL, /BL, and the column switches 78a, 78b are capable of amplifying. Therefore, the read operation can be performed using only the number of signals held in the memory cell MC.

The column switch 80a is connected to the bit line BL at one end, and receives the write data signal WDB at the other end. The gate of the nMOS on the one-end side of the column switch 80a receives a write controlling signal WCLZ. Besides, the gate of the nMOS on the other-end side of the column switch 80a receives the column selecting signal CL1 (or CL2).

The column switch 80b is the same as the column switch 80a except the connection to the bit line /BL at one end and it receives the write data signal /WDB.

The pMOS 82a, 82b have their gates connected to a ground line VSS, have their sources connected to supply voltage lines VDD, and have their drains respectively connected to the signal lines of read data signals RDB, /RDB.

Incidentally, the read controlling signal RCLX is generated from the column line controlling signal CLCNT1 shown in FIG. 6, while the write controlling signal WCLZ is generated from the column line controlling signal CLCNT2.

Figure 8:
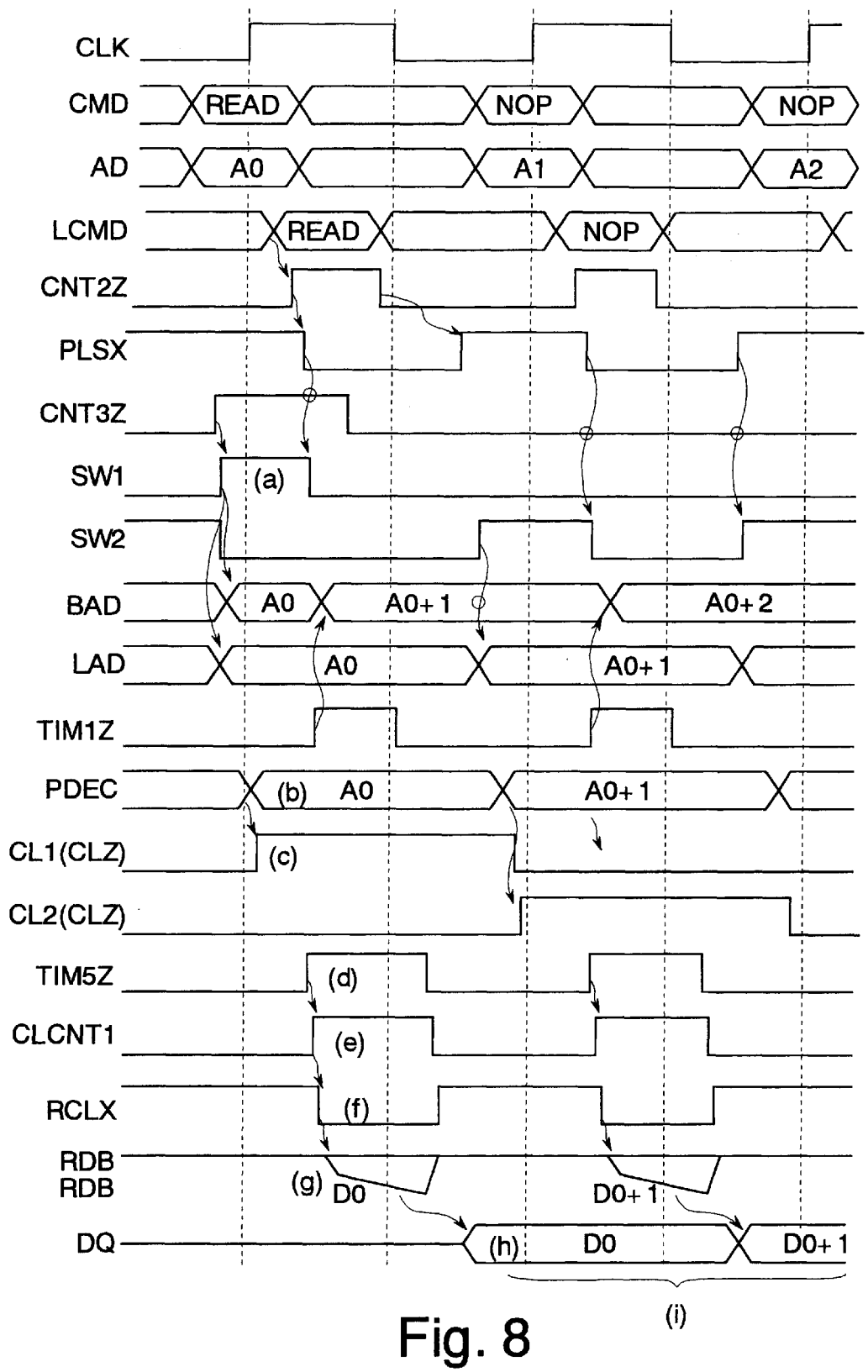
FIG. 8 is a timing chart showing a burst read operation in the second embodiment.

FIG. 8 shows the timings of the principal signals of a burst read operation in the semiconductor integrated circuit explained above.

First, as in FIG. 5 showing the first embodiment, a command signal CMD (READ) and an address signal AD (A0) are fed, and a switching signal SW1 is activated (FIG. 8(a)).

The predecoder 70 shown in FIG. 6 receives a latched address signal LAD (A0) and outputs a predecoding signal PDEC (FIG. 8(b)). The predecoder 70 is not controlled by the enable signal ENZ at this state so that it outputs the predecoding signal PDEC immediately after having received the latched address signal LAD.

A column decoder 54 receives the predecoding signal PDEC, and activates the column selecting signal CL1 (CLZ) corresponding to the address signal AD (A0) (FIG. 8(c)). The activation timing of the column selecting signal CL1 is earlier than it is in the first embodiment.

The nMOS on the one-end side of each of the column switches 78a, 78b is turned on by the activation of the column selecting signal CL1.

Besides, a controlling circuit, not shown, corresponding to row addresses is operated to select a predetermined word line WL. Data held in each memory cell MC is transmitted to the bit line BL (or /BL) in accordance with the selection of the word line WL. The voltages of the bit lines BL, /BL are applied to the gates of the nMOS on the other-end sides of the column switches 78a, 78b. As a result, either of the column switches 78a, 78b is turned on. At this time, the sense amplifier 72 need not be operated. In this embodiment, the controlling circuit for use in a read operation is of the direct sense system, so that the data held in the memory cell MC is not destroyed even when the column switch 78a or 78b is turned on before the operation of the sense amplifier 72.

The read/write timing controlling circuit 66 receives the control signal CNT4Z outputted from the command decoder 62, and outputs the timing signal TIM5Z (FIG. 8(d)).

The read/write controlling circuit 68 of the core controlling unit 14 receives the timing signal TIM5Z, and outputs the column line controlling signal CLCNT1 (FIG. 8(e)). The read controlling signal RCLX shown in FIG. 7 goes to a low level by receiving the high level of the column line controlling signal CLCNT1 (FIG. 8(f)).

Owing to the low level of the control signal RCLX, either of the read data signals RDB, /RDB is turned into the low level in accordance with the voltages of the bit lines BL, /BL (FIG. 8(g)). The turn is preceded or succeeded by the operation of the sense amplifier 72, whereby the signal levels of the bit lines BL, /BL are amplified, and the level difference of the voltages of the read data signals RDB, /RDB can be obtained.

Then, the levels of the read data signals RDB, /RDB are transmitted as a data signals DQ, and the read operation of the address AD (A0) is completed (FIG. 8(h)).

Thereafter, the data of the memory cell MC corresponding to the burst address BAD is read out in the same manner as in FIG. 5 (FIG. 8(i)).

Figure 9:
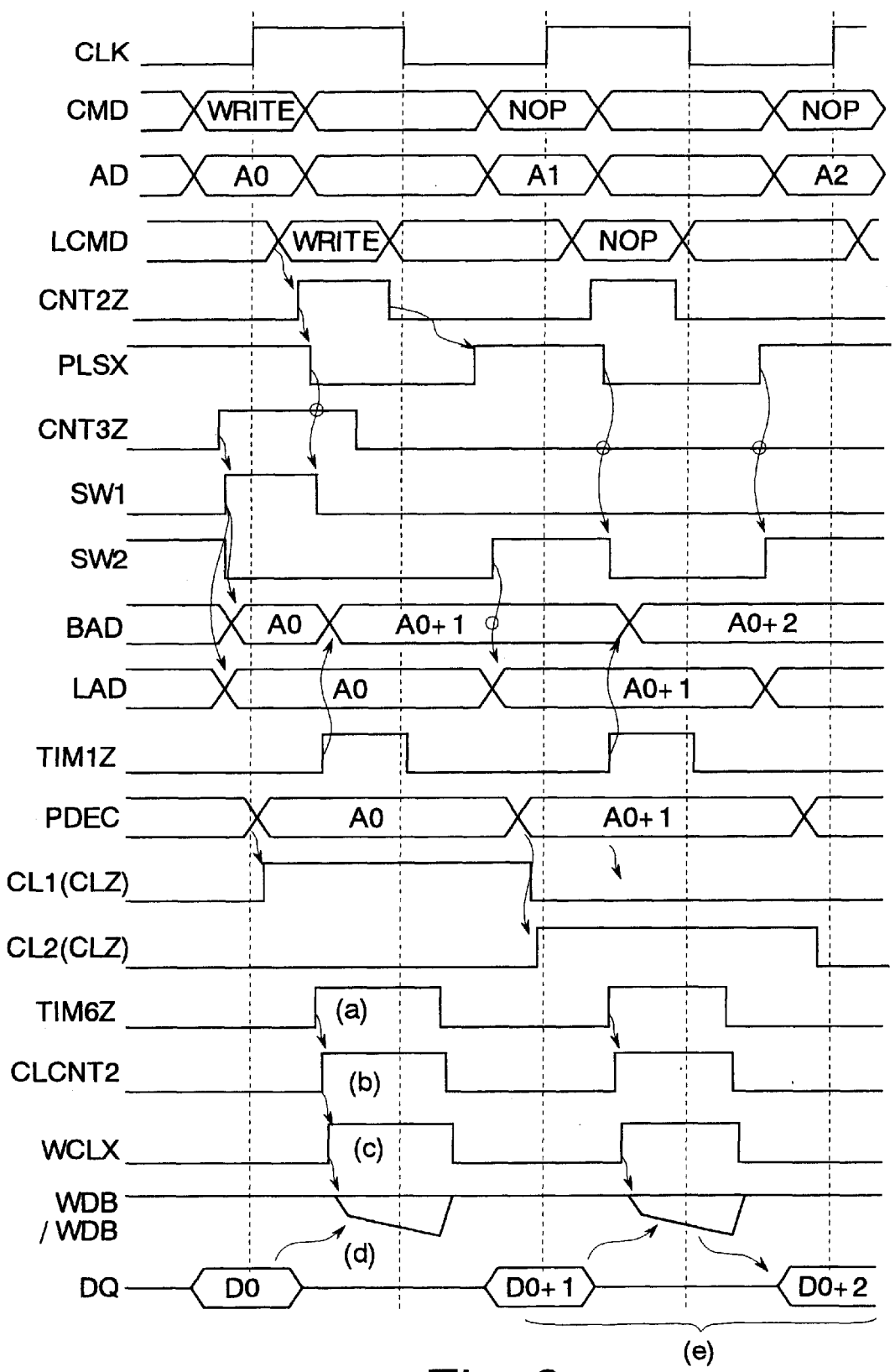
FIG. 9 is a timing chart showing a burst write operation in the second embodiment.

FIG. 9 shows the timings of the principal signals of a burst write operation in the semiconductor integrated circuit explained above. Incidentally, the waveforms of a clock signal CLK through the column selecting signal CL2 are the same as they are in FIG. 8 and the description shall therefore be omitted.

The read/write timing controlling circuit 66 shown in FIG. 6 receives the control signal CNT5Z outputted from the command decoder 62 and outputs the timing signal TIM6Z (FIG. 9(a)).

The read/write controlling circuit 68 of the core controlling unit 14 receives the timing signal TIM6Z, and outputs the column line controlling signal CLCNT2 (FIG. 9(b)). The write controlling signal WCLZ shown in FIG. 7 is turned into the high level by receiving the high level of the column line controlling signal CLCNT2 (FIG. 9(c)).

In addition, an input/output buffer 24 accepts the data signal DQ in synchronization with the rise of the clock signal CLK and outputs the accepted signal as an internal write data signal IWDQ. An input/output controlling circuit 60 accepts the internal write signal IWDQ in synchronization with a timing signal TIM3Z and outputs the accepted signal as the write data signals WDB, /WDB (FIG. 9(d)).

The column switches 80a, 80b shown in FIG. 7 are turned on by the high levels of the column switching signal CL1 and write controlling signal WCLZ. Then, the write data signals WDB, /WDB are transmitted to the bit lines BL, /BL and are written into the memory cell MC.

Thereafter, data is written into the memory cell MC corresponding to the burst address BAD (FIG. 9(e)).

In this embodiment, the same effects as in the first embodiment described above can be attained. Further, in this embodiment, the activation timing of the column selecting signal CLZ can be made earlier and the read and write operations can be further quickened.

Figure 10:
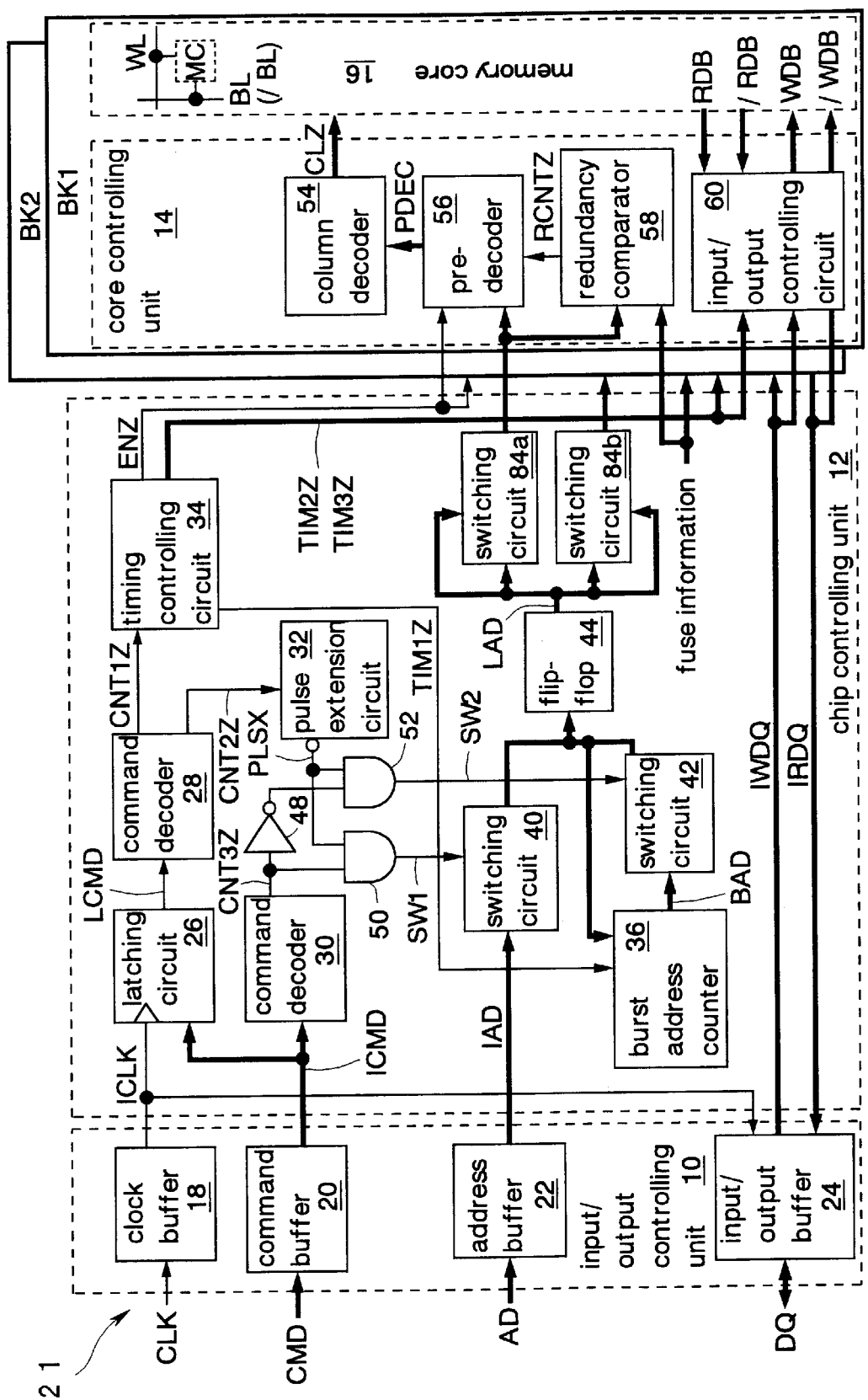
FIG. 10 is a block diagram showing the third embodiment of the semiconductor integrated circuit in the present invention.

FIG. 10 shows the third embodiment of the semiconductor integrated circuit and the controlling method of the same in the present invention. The same components as in the first embodiment will be indicated by identical reference numbers and the detailed description thereof shall be omitted.

In this embodiment, a chip controlling unit 12 is additionally provided with switching circuits 84a, 84b. Besides, the semiconductor integrated circuit includes two banks (BK1, BK2) each of which is composed of a core controlling unit 14 and a memory core 16. The remaining construction is the same as in the first embodiment.

The switching circuit 84a receives a latched address signal LAD, and it outputs the received latched address signal LAD to the predecoder 56 and redundancy comparator 58 of the bank BK1 in a case where the latched address signal LAD corresponds to the bank BK1. In the figure, the latched address signal LAD fed from the lower side of the switching circuit 84b corresponds to a bank address.

Likewise, the switching circuit 84b receives a latched address signal LAD, and it outputs the received latched address signal LAD to the predecoder 56 and redundancy comparator 58 of the bank BK2 in a case where the latched address signal LAD corresponds to the bank BK2. In the figure, the latched address signal LAD fed from the upper side of the switching circuit 84a corresponds to a bank address.

Also in this embodiment, the same effects as in the first embodiment described before can be attained. Further, in this embodiment, the switching circuits 84a, 84b output the received latched address signals LAD to only the banks which correspond to the latched address signals, respectively. Only the core controlling unit 14 of the bank to be actually operated is accordingly operated, whereby the power consumption of the semiconductor integrated circuit can be reduced.

Figure 11:
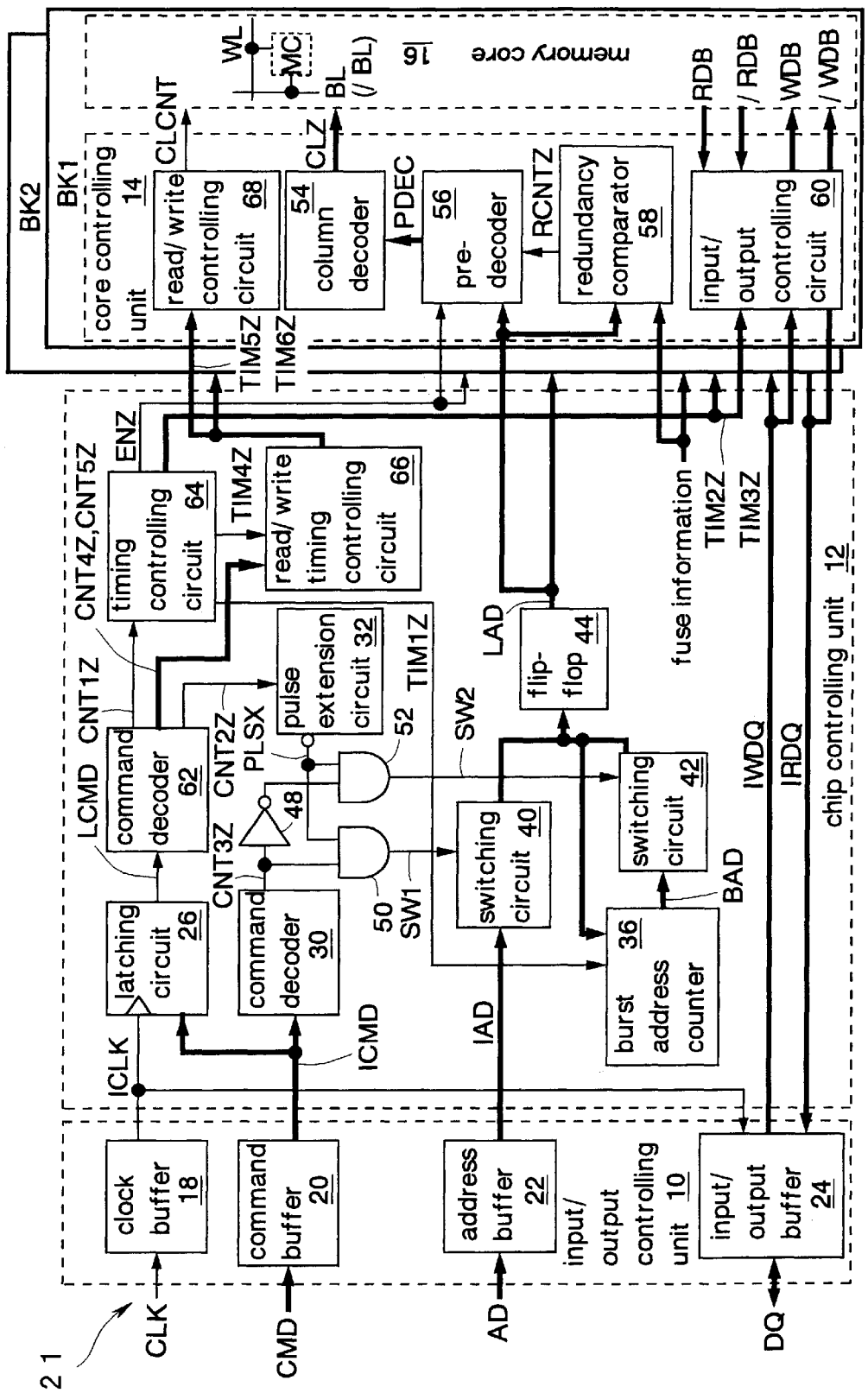
FIG. 11 is a block diagram showing the fourth embodiment of the semiconductor integrated circuit in the present invention.

FIG. 11 shows the fourth embodiment of the semiconductor integrated circuit and the controlling method of the same in the present invention. The same components as in the first and second embodiments are indicated by identical reference numerals and the detailed description thereof shall be omitted here.

In this embodiment, the semiconductor integrated circuit includes two banks (BK1, BK2) each of which is composed of a core controlling unit 14 and a memory core 16. The remaining construction is the same as in the second embodiment.

The flip-flop circuit 44 of a chip controlling unit 12 outputs a latched address signal LAD to both the banks BK1, BK2 at any time. The redundancy comparators 58 of the banks BK1, BK2 start redundancy comparisons even in a case where the latched address signal LAD does not correspond to their own banks.

Also in this embodiment, the same effects as in the first and second embodiments described before can be attained. Further, in this embodiment, the flip-flop circuit 44 outputs the latched address signal LAD to both the banks BK1, BK2. Therefore, the operation of the core controlling unit 14 of the bank which is likely to operate can be started beforehand. As a result, the redundancy comparison is started earlier, and read and write operations can be performed at high speed.

Figure 12:
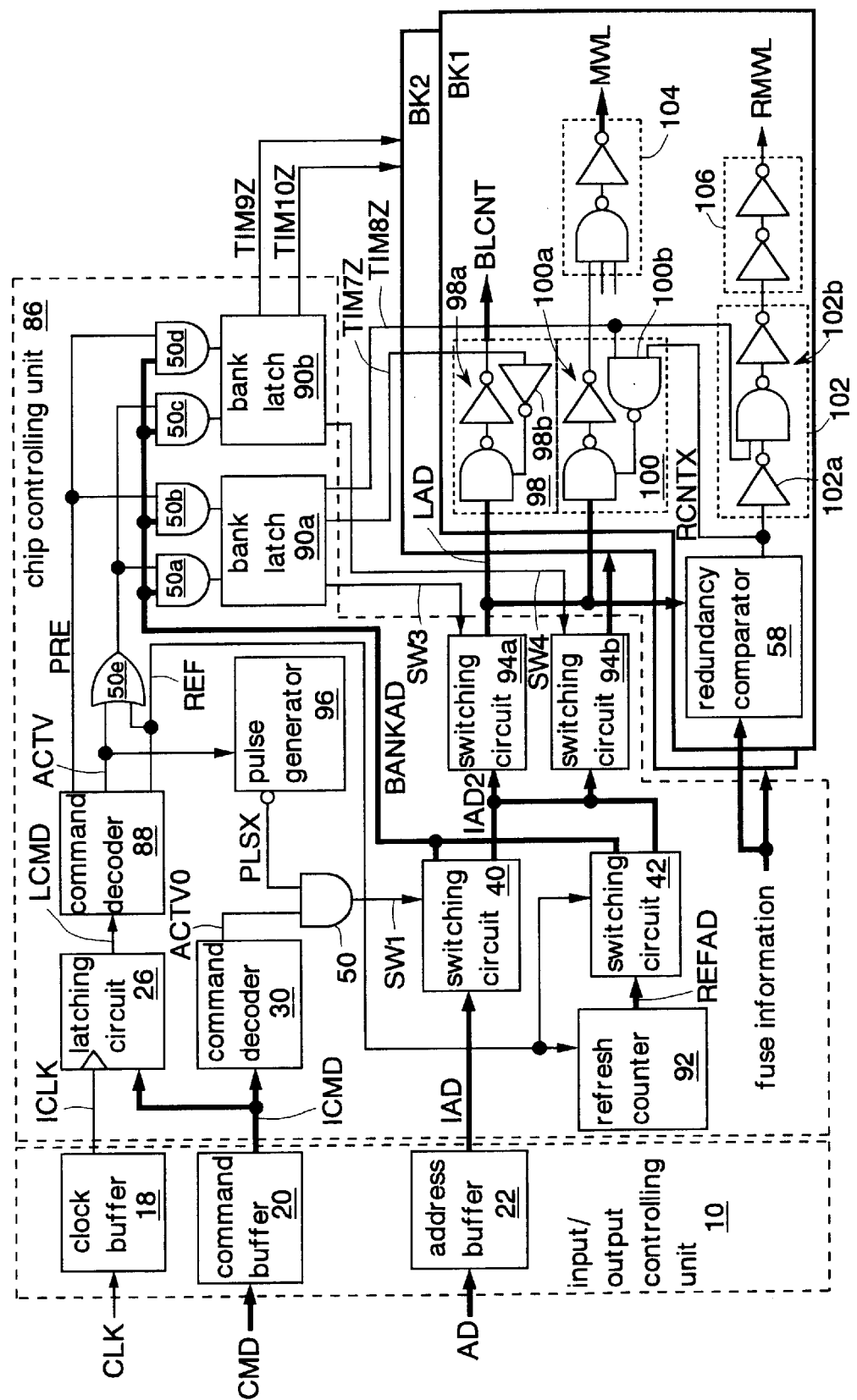
FIG. 12 is a block diagram showing the fifth embodiment of the semiconductor integrated circuit in the present invention.

FIG. 12 shows the fifth embodiment of the semiconductor integrated circuit and the controlling method of the same in the present invention. The same components as in the foregoing embodiments are indicated by identical numerals and the detailed description shall be omitted here.

The semiconductor integrated circuit includes an input/output controlling unit 10, a chip controlling unit 86, and banks BK1, BK2.

The input/output controlling unit 10 includes a clock buffer 18, a command buffer 20, an address buffer 22, and an input/output buffer not shown.

The chip controlling unit 86 includes a latching circuit 26, command decoders 30, 88, bank latches 90a, 90b, a refresh counter 92, switching circuits 40, 42, 94a, 94b, a pulse generator 96, and AND gates 50, 50a, 50b, 50c, 50d, as well as an OR gate 50e. In addition, the chip controlling unit 86 includes the same circuits operating corresponding to column addresses as it does in the first embodiment (not shown).

The command decoder 30 receives an internal command signal ICMD and decodes a command, and it outputs an activation command signal ACTV0.

The command decoder 88 receives a latched command signal LCMD and decodes a command, and it outputs a precharge command signal PRE, an activation command signal ACTV and a refresh command signal REF.

The pulse generator 96 receives the activation command signal ACTV, and outputs a pulse signal PLSX.

The AND gate 50 activates a switching signal SW1 when the activation command signal ACTV0 and the pulse signal PLSX are both at high levels.

The OR gate 50e receives either of the activation command signal ACTV or the refresh command signal REF, and outputs the received signal to the AND gates 50a, 50c.

The AND gate 50a transmits the output of the OR gate 50e to the bank latch 90a when it has received a bank address signal BANKAD corresponding to the bank BK1. The AND gate 50a outputs a signal correspondent to the precharge command signal PRE when it has received the bank address signal BANKAD corresponding to the bank BK1.

The AND gate 50c transmits the output signal of the OR gate 50e to the bank latch 90b when it has received a bank address signal BANKAD corresponding to the bank BK2. The AND gate 50d outputs a signal correspondent to the precharge command signal PRE when it has received the bank address signal BANKAD corresponding to the bank BK2.

The bank latch 90a activates a switching signal SW3 upon receiving the activation command signal ACTV, and inactivates the switching signal SW3 upon receiving the precharge command signal PRE. Besides, the bank latch 90a outputs timing signals TIM7Z, TIM8Z in synchronization with the switching signal SW3.

The bank latch 90b activates a switching signal SW4 upon receiving the activation command signal ACTV, and inactivates the switching signal SW4 upon receiving the precharge command signal PRE. Besides, the bank latch 90b outputs timing signals TIM9Z, TIM10Z in synchronization with the switching signal SW4.

The refresh counter 92 receives the refresh command signal REF and outputs a refresh address REFAD.

The switching circuit 40 is turned on in accordance with the activation of the switching signal SW1, thereby to output an internal address signal IAD as the bank address signal BANKAD and an internal address signal IAD2.

The switching circuit 42 is turned on in accordance with the activation of the refresh command signal REF, thereby to output the refresh address REFAD as the bank address signal BANKAD and the internal address signal IAD2.

The switching circuit 94a is turned on in accordance with the activation of the switching signal SW3, thereby to output the internal address signal IAD2 to the bank BK1 as a latched address signal LAD.

The switching circuit 94b is turned on in accordance with the activation of the switching signal SW4, thereby to output the internal address signal IAD2 to the bank BK2 as the latched address signal LAD. Here, latches not shown are formed at the output nodes of the switching circuits 94a, 94b and the latched address signal LAD is held by the latches.

Incidentally, the switching circuits 94a, 94b may well have the functions of recognizing the selections of the banks BK1, BK2 upon receiving the bank address signal BANKAD, respectively. In this case, the output of the switching circuit 94a (or 94b) may well be changed only when the switching circuit 94a (or 94b) activated by the control of the corresponding bank latch 90a (or 90b) has recognized the selection of the corresponding bank BK1 (or BK2).

Each of the banks BK1, BK2 includes a redundancy comparator 58, predecoders 98, 100, 102 as well as a main word decoder 104, and a buffer circuit 106. Besides, each of the banks BK1, BK2 is constructed of a core controlling unit and a memory core similar to those of the first embodiment.

The redundancy comparator 58 compares the latched address signal LAD with fuse information, and it outputs a redundancy controlling signal RCNTX in case of having decided the latched address signal LAD as a relief address.

The predecoder 98 is configured of an AND circuit 98a which consists of an NAND gate and an inverter, and an inverter 98b whose output node is connected to the source of the endmost nMOS (not shown) constituting the NAND gate. The inverter 98b receives the timing signal TIM7Z from the bank latch 90a, and outputs the inverted signal thereof. When the timing signal TIM7Z is at its high level, the predecoder 98 receives the latched address signal LAD fed through the switching circuit 94a, by means of the AND circuit 98a, whereupon it outputs a decoded signal as a block controlling signal BLCNT.

The predecoder 100 is configured of an AND circuit 100a which consists of a NAND gate and an inverter, and a NAND gate 100b whose output node is connected to the source of the endmost nMOS (not shown) constituting the NAND gate. When the redundancy controlling signal RCNTX is at its high level (or is inactivated), the NAND gate 100b inverts the timing signal TIM8Z from the bank latch 90a and outputs the resulting signal. When the redundancy controlling signal RCNTX and the timing signal TIM8Z are at their high levels, the predecoder 100 receives the latched address signal LAD fed through the switching circuit 94a, by means of the AND circuit 100a, whereupon it outputs a decoded signal.

The main word decoder 104 receives the outputs from a plurality of such predecoders 100, and it outputs a decoded signal as a main word line signal MWL.

The predecoder 102 is configured of an inverter 102a, and an AND circuit 102b which consists of an NAND gate and an inverter. The inverter 102a receives the redundancy controlling signal RCNTX, and outputs the inverted signal thereof to the AND circuit 102b. When the output of the inverter 102a is at its high level, the AND circuit 102b outputs the timing signal TIM8Z to the buffer circuit 106.

The buffer circuit 106 is formed by connecting two inverters in cascade. This buffer circuit 106 receives the output from the predecoder 102, and outputs the received signal as a redundancy main word line signal RMWL.

Figure 13:
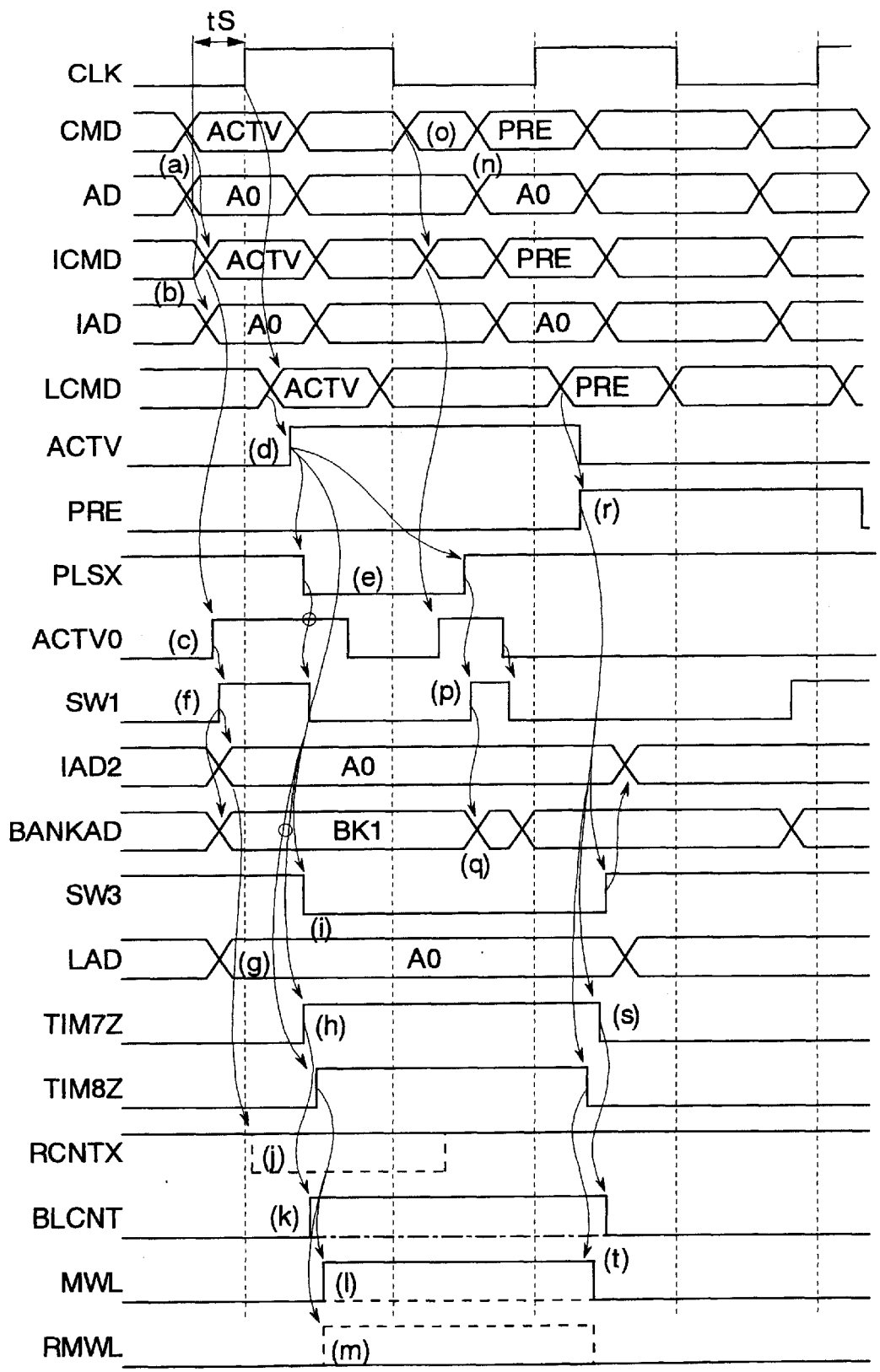
FIG. 13 is a timing chart showing the operations of a row address system in the fifth embodiment.

FIG. 13 shows the timings of the principal signals of operations corresponding to row addresses in the semiconductor integrated circuit explained above.

First, a command signal CMD (ACTV) and an address signal AD (A0) are respectively fed to the command buffer 20 and address buffer 22 shown in FIG. 12 (FIG. 13(a)). Here, the ACTV command is a command for activating a word line.

The command buffer 20 and address buffer 22 receive the command signal CMD and address signal AD, and they output the received signals as the internal command signal ICMD and internal address signal IAD, respectively (FIG. 13(b)).

The command decoder 30 decodes the internal command signal ICMD and outputs the activation command signal ACTV0 (FIG. 13(c)).

The latching circuit 26 accepts the internal command signal ICMD in synchronization with the rising edge of an internal clock signal ICLK, and outputs the accepted signal as the latched command signal LCMD (ACTV). Subsequently, the command decoder 88 decodes the latched command signal LCMD and outputs the activation command signal ACTV (FIG. 13(d)).

The pulse generator 96 receives the high level of the activation command signal ACTV, and holds the pulse signal PLSX at low level for a predetermined period (FIG. 13(e)).

The AND gate 50 holds the switching signal SW1 at the high level during a period for which the activation command signal ACTV0 and the pulse signal PLSX are both at the high levels (FIG. 13(f)).

The switching circuit 40 turns on its switch in accordance with the activation of the switching signal SW1, thereby to output the internal address signal IAD as the internal address signal IAD2.

At this time, the switching signal SW3 is held at the high level. Therefore, the switching circuits 94a receives the internal address signal IAD2 and outputs the received signal as the latched address signal LAD (FIG. 13(g)). That is, also in the operations corresponding to the row address, the banks BK1, BK2 are capable of receiving the latched address signal LAD before or immediately after the rise of a clock signal CLK. As a result, the circuits corresponding to the. row addresses can be operated earlier.

Meanwhile, the AND gate 50a receives the bank address signal BANKAD (A0) corresponding to the bank BK1 and outputs the signal corresponding to the activation command signal ACTV. On this occasion, the output of the AND gate 50c holds its low level.

The bank latch 90a receives the output of the AND gate 50a, and it turns the switching signal SW3 to the low level and the timing signals TIM7Z, TIM8Z to the high levels (FIG. 13(h)).

The switching circuit 94a receives the low level of the switching signal SW3, and it stops the acceptance of the internal address signal IAD2 and outputs the latched address signal LAD held at this time (FIG. 13(i)).

The redundancy comparator 58 compares the latched address signal LAD with the fuse information, and it outputs the relief controlling signal RCNTX when the latched address signal LAD coincides with the relief address (indicated by a broken line in FIG. 13(j)). The latched address signal LAD is fed to the redundancy comparator 58 earlier. Also in this embodiment, therefore, it is possible to decide if or not the address signal AD coincides with the relief address earlier than it is in the prior art.

The predecoder 98 of the bank BK1 is activated upon receiving the high level of the timing signal TIM7Z. This predecoder 98 decodes the latched address signal LAD, and outputs the decoded signal as the block controlling signal BLCNT (FIG. 13(k)).

The predecoder 100 is activated upon receiving the high level of the timing signal TIM8Z. This predecoder 100 decodes the latched address signal LAD, and outputs the decoded signal as the main word line signal MWL (FIG. 13(l)). At this time, the redundancy main word line signal RMWL is not activated.

In the case where the latched address signal LAD coincides with the relief address, the predecoder 102 is activated upon receiving the high level of the timing signal TIM8Z. The predecoder 102 and the buffer circuit 104 output the relief controlling signal RCNTX as the redundancy main word line signal RMWL (indicated by a broken line in FIG. 13(m)).

Thereafter, the command signal CMD (PRE) and the address signal AD (A0) are respectively fed to the command buffer 20 and address buffer 22 (FIG. 13(n)). Here, the PRE command is a command for setting bit lines at a predetermined voltage.

In a case where an invalid command signal CMD is fed before the feed of the precharge command PRE (FIG. 13(o)), the activation command signal ACTV0 and the switching signal SW1 are activated (FIG. 13(p)). The switching circuit 40 is turned on in accordance with the activation of the switching signal SW1, thereby to output the internal address signal IAD as the bank address signal BANKAD (FIG. 13(q)). However, since the output levels (SW3, TIM7Z, TIM8Z) of the bank latch 90a do not vary, the chip controlling unit 86 does not malfunction.

The latching circuit 26 accepts the internal command signal ICMD (PRE) in synchronization with the rising edge of the internal clock signal ICLK, and outputs the accepted signal as the latched command signal LCMD. The command decoder 88 decodes the latched command signal LCMD and outputs the precharge command signal PRE (FIG. 13(r)).

The AND gate 50b receives the bank address signal BANKAD (A0) corresponding to the bank BK1 and outputs the signal corresponding to the precharge command signal PRE. On this occasion, the output of the AND gate 50d holds its low level.

The bank latch 90a receives the output of the AND gate 50b, and it turns the switching signal SW3 to the high level and the timing signals TIM7Z, TIM8Z to the low level (FIG. 13(s)).

Then, the block controlling signal BLCNT and the main word line signal MWL (or the redundancy main word line signal RMWL) are inactivated and the precharge operation is started (FIG. 13(*t*)).

In a case where the fed command signal indicates a refresh command, the refresh counter 92 shown in FIG. 12 receives the refresh command signal REF and outputs the refresh address REFAD. The switching circuit 42 is turned on upon receiving the refresh command signal REF, thereby to output the refresh address REFAD as the bank address signal BANKAD and the internal address signal IAD2. Thereafter, the block controlling signal BLCNT and the main word line signal MWL (or the redundancy main word line signal RMWL) are activated as in the foregoing, and the refresh operation is performed.

Also in this embodiment, the same effects as in the first and second embodiments described above can be attained.

Figure 14:
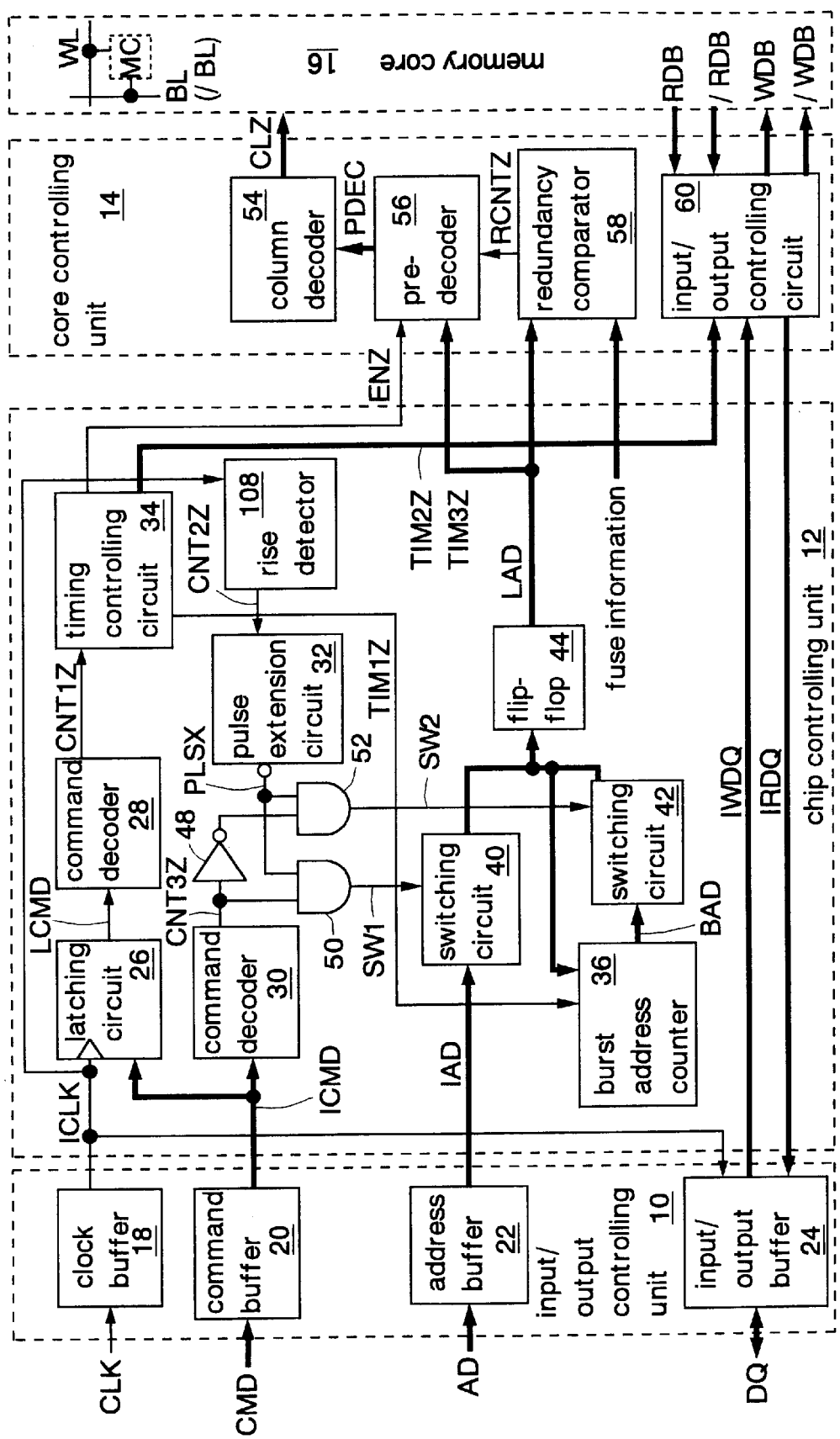
FIG. 14 is a block diagram showing the sixth embodiment of the semiconductor integrated circuit in the present invention.

FIG. 14 shows the sixth embodiment of the semiconductor integrated circuit and the controlling method of the same in the present invention. The same components as in the first embodiment explained above are indicated by identical reference numbers and the detailed description thereof shall be omitted here.

In this embodiment, a chip controlling unit 12 is additionally provided with a rise detector 108 which generates a control signal CNT2Z by detecting the rising edge of an internal clock signal ICLK. Accordingly, a pulse signal PLSX is generated using the rising edge of the internal clock signal ICLK. The remaining construction is the same as in the first embodiment.

Figure 15:
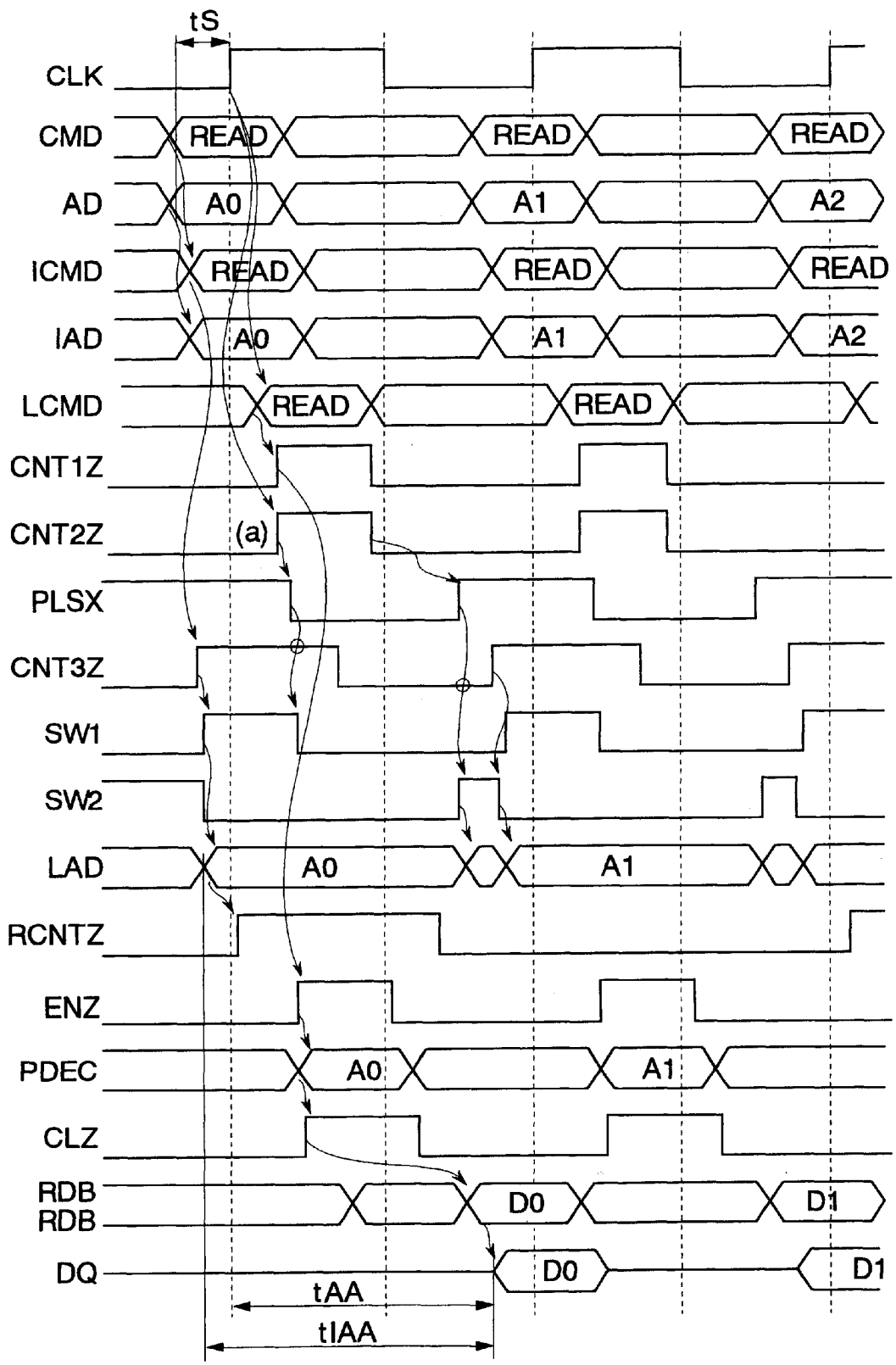
FIG. 15 is a timing chart showing a read operation in the sixth embodiment.

FIG. 15 shows the timings of the principal signals of a read operation in the semiconductor integrated circuit explained above.

In this embodiment, the control signal CNT2Z is generated in synchronization with the rise of a clock signal CLK (the internal clock signal ICLK) (FIG. 15(*a*)). Therefore, the activation timing of the control signal CNT2Z can be made earlier than in the first embodiment in which this control signal CNT2Z is generated from the latched command signal LCMD.

Figure 16:
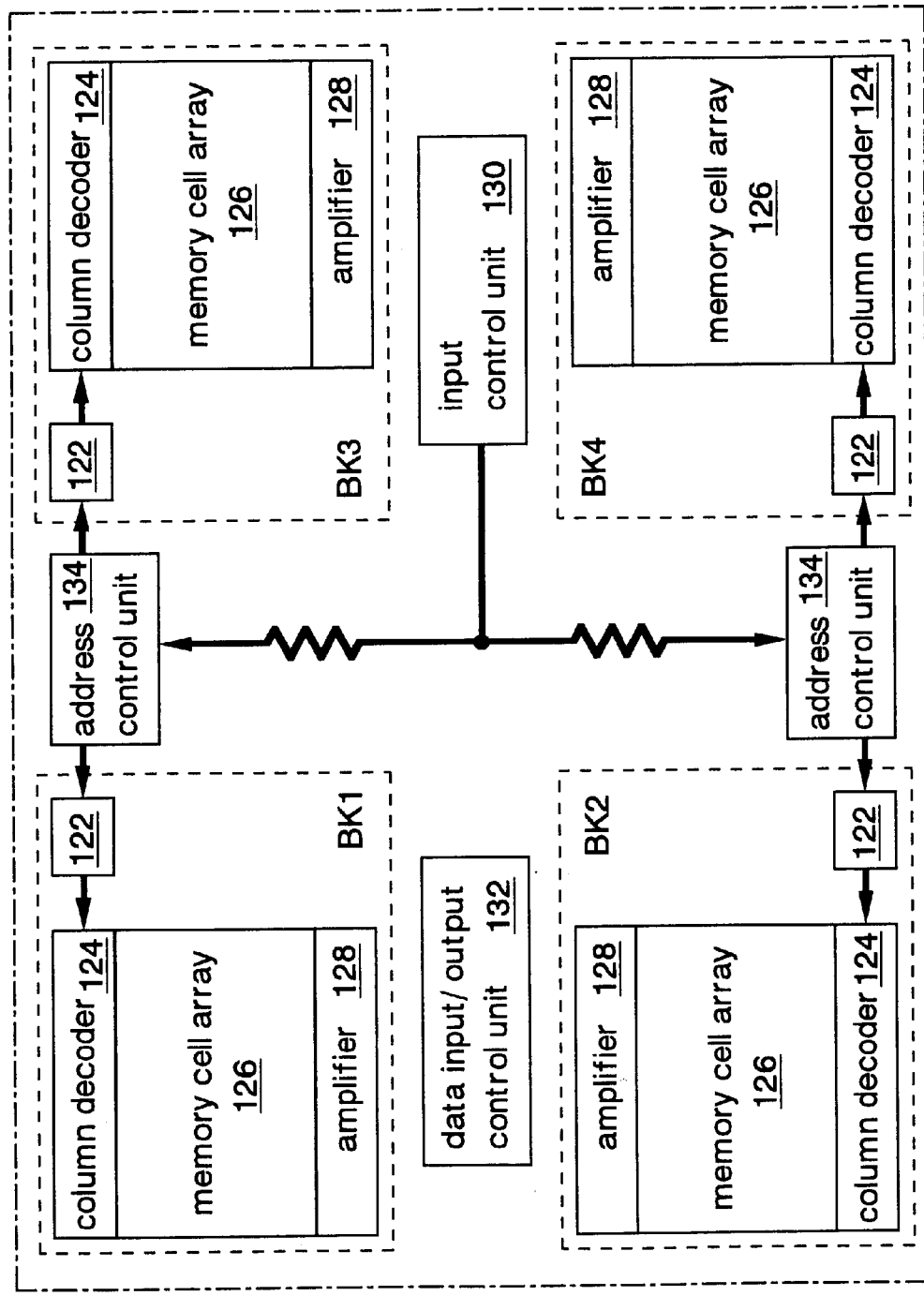
FIG. 16 is a block diagram showing the seventh embodiment of the semiconductor integrated circuit in the present invention.

FIG. 16 shows the seventh embodiment of the semiconductor integrated circuit.

The semiconductor integrated circuit of this embodiment is formed on a silicon substrate as an FCRAM (Fast Cycle RAM) using CMOS process technology. In the FCRAM, its internal operations are divided into three stages and the operation in each stage is automatically completed. This makes it possible to perform a pipeline processing not only for data input/output but also address accepting operation and memory core operation. The use of the pipeline processing makes it possible to shorten the operation cycle. In order to give top priority on shortening its access time, the FCRAM of this embodiment is designed to have address terminals non-multiplexed and to input row addresses and column addresses at once. The thick signal lines indicated in the figures are each constructed by plural lines. Signals that have "Z" at their end show a positive logic (activated at the high level).

The FCRAM has four memory cores (to be referred to as banks BK1, BK2, BK3, BK4 below). The banks BK1–BK4 have an address predecoder 122, a column decoder 124, a memory cell array 126 that has a plurality of memory cells, and an amplifier 128. The memory cells are connected to bit lines and word lines that are not shown in the figures, and the bit lines each are connected to column switches for inputting/outputting data. The banks BK1–BK4 are selected in accordance with a bank address. In a crisscross region formed between these banks BK1–BK4, an input control unit 130 and a data input/output control unit 132 are placed at both ends of the horizontal direction in the figure. An address control unit 134 is respectively placed at both ends of the vertical direction in the figure. Other than shown in the figure, control circuits such as an internal voltage generator circuit are placed in the region. In this embodiment, in order to make data input/output faster, the amplifier 128 is placed adjacent to the data input/output control unit 132 (inside of the chip). Therefore, the column decoder 124 that receives the address is placed at the periphery of the chip.

The input control unit 130 receives a clock signal, a command signal, and an address signal (corresponding to CLK, CMD, AD, which will be described later) from the exterior, and outputs control signal or the like to the address control unit 134. The length of the wiring from the input control unit 130 to the address control unit 134 is several millimeters, and the transmission delay time of a signal transmitted to the wiring is also long. Moreover, a large area is necessary for such wirings.

Figure 17:
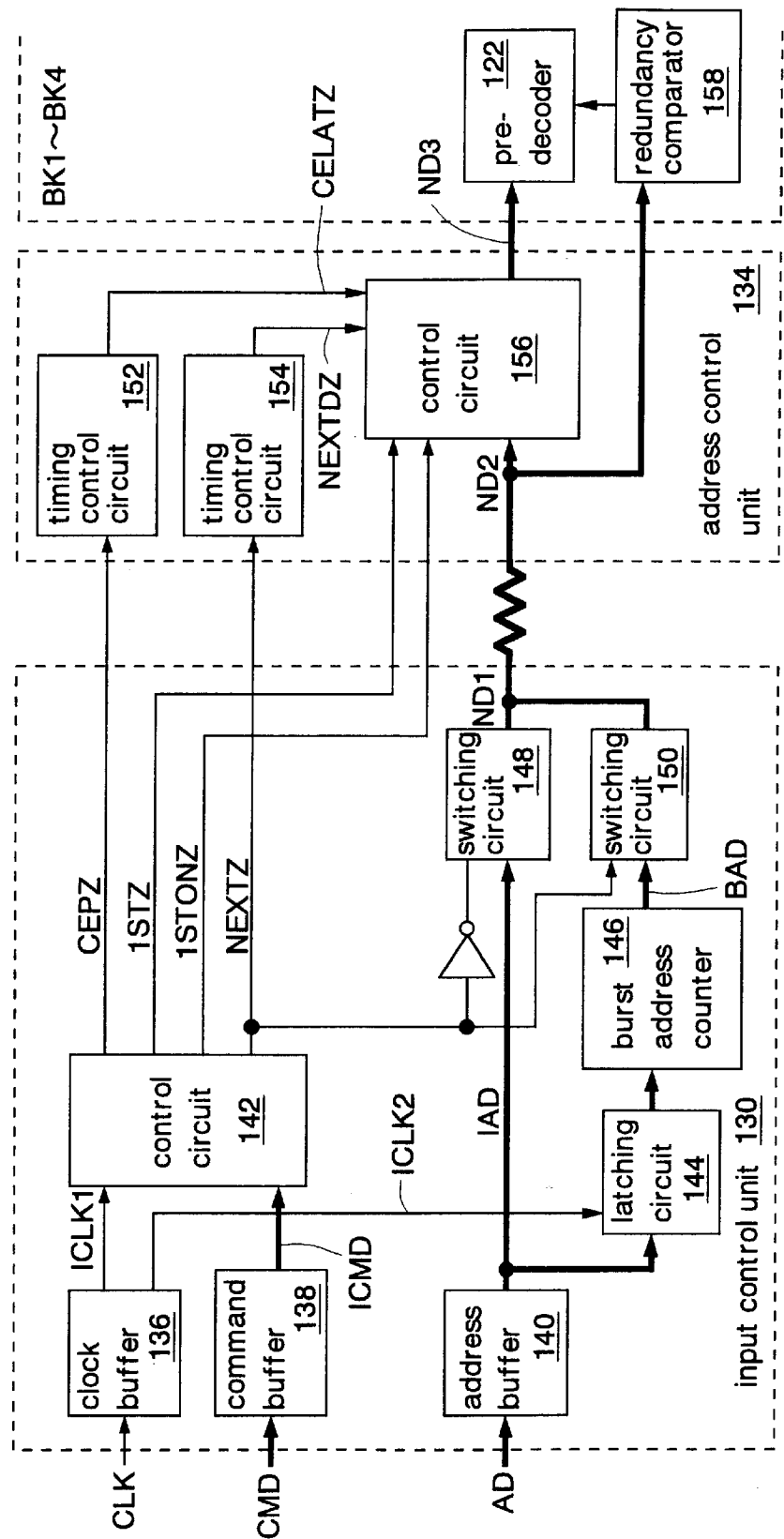
FIG. 17 is a block diagram showing the main part of FIG. 16.

FIG. 17 shows the main part of FIG. 16.

The input control unit 130 has a clock buffer 136, a command buffer (a command input circuit) 138, an address buffer (address input circuit) 140, a control circuit 142, a latching circuit 144, a burst address counter 146, (an address generating circuit), and switching circuits 148, 150. The address control unit 134 has timing control units 152, 154, and a control circuit 156. Also, the banks BK1–BK4 have redundancy comparator 158.

The clock buffer 136 receives a clock signal CLK, and outputs the received clock signal as internal clock signals ICLK1, ICLK2. The command buffer 138 receives a command signal CMD, and outputs the received signal as an internal command signal ICMD. The address buffer 140 receives the address signal AD, which is an external address, and outputs the received signal as an address signal IAD, which is transmitted internally.

The control circuit 142 receives the internal clock signal ICLK and the internal command signal ICMD, and outputs control signals CEPZ, 1STONZ, NEXTZ, and accepting signal 1STZ in accordance with the received internal command signal ICMD. The generating timing for these control signals will be explained later with reference to FIG. 19.

The latching circuit 144 accepts the address signal IAD in synchronization with the rising edge of the internal clock signal ICLK2. Then the latching circuit 144 outputs the accepted signal to the burst address counter 146. Based on the received address signal from the latching circuit 144, the burst address counter 146 sequentially generates and outputs burst address BAD.

The switching circuit 148 is turned on during the low-level period of the control signal NEXTZ, and transmits the address signal IAD to the node ND1. The switching circuit 150 is turned on during the high level period of the control signal NEXTZ, and transmits the burst address signal BAD to the node ND1. That is, the switching circuits 148, 150 operate as an output switching circuit that selects either the address signal IAD or the burst address signal BAD in accordance with the control signal NEXTZ, and operate as an output switching circuits.

The timing control circuit 152 receives the control signal CEPZ, and generates the accepting signal CELATZ. The control signal CEPZ is a timing signal that activates the column switches. The timing control circuit 154 generates the accepting signal NEXTDZ based on the control signal NEXTZ. As will be mentioned later, the control circuit 156 transmits the address signal transmitted to node ND2 to node ND3 in accordance with the accepting signals 1STZ, NEXTDZ, CELATZ, and the control signal 1STONZ.

The redundancy comparator 158 compares the address transmitted to node ND2 with invalid address information, and outputs a coincidence signal COIN when both addresses coincide. The predecoder 122 receives the coincidence signal COIN, and activates the redundancy column switch that is not shown in the figure.

Figure 18:
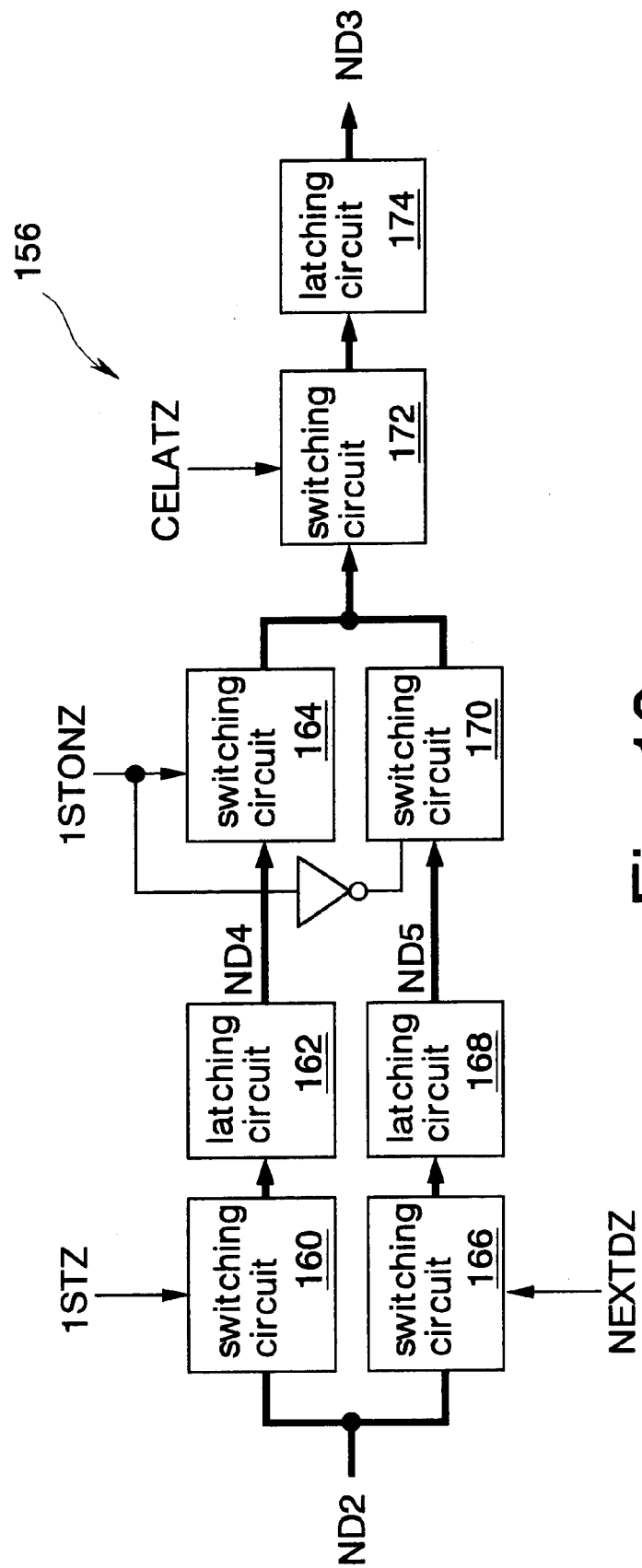
FIG. 18 is a circuit diagram showing the details of the control circuit 156 of FIG. 17.

FIG. 18 shows the details of the control circuit 156.

The control circuit 156 has a switching circuit 160, a latching circuit 162, and a switching circuit 164, which are connected in series; a switching circuit 166, a latching circuit 168, and a switching circuit 170, which are connected in series; a switching circuit 172 and a latching circuit 174 which are connected in series; and an invertor.

The switching circuit 160 is turned on when the accepting signal 1STZ is activated, and transmits the address signal transmitted to node ND1 to the latching circuit 162. The latching circuit 162 latches the address signal transmitted from the switching circuit 160, and outputs the latched signal to the node ND4. That is, a holding circuit for holding an address signal is formed of the switching circuit 160 and the latching circuit 162.

The switching circuit 166 is turned on when the accepting signal NEXTDZ is activated, and transmits the address transmitted to node ND1 to the latching circuit 168. The latching circuit 168 latches the address transmitted from switching circuit 166, and outputs the latched signal to the node ND5. That is, another holding circuit for holding an address signal is formed of the switching circuit 166 and the latching circuit 168.

The switching circuit 164 is turned on when the control signal 1STONZ is activated, and transmits the address signal transmitted to node ND4 to the switching circuit 172. The switching circuit 170 is turned on when the control signal 1STONZ is inactivated, and transmits the address transmitted to the node ND5 to the switching circuit 172. That is, the switching circuits 164, 170 operate as a switching circuit that selects and outputs either the address signal IAD or the burst address signal BAD in accordance with the control signal 1STONZ.

The switching circuit 172 is turned on when the accepting signal CELATZ is activated, and transmits the address signal from switching circuit 164 or 170 to the latching circuit 174. The latching circuit 174 latches the address signal transmitted from the switching circuit 172, and outputs the latched signal to the node ND3.

The switching circuits 160, 164, 166, 170, and 172 are formed of CMOS transmission gates, for example. The latching circuits 162, 168, 174 are formed of two invertors having input of one invertor connected to output of the other, for example.

Figure 19:
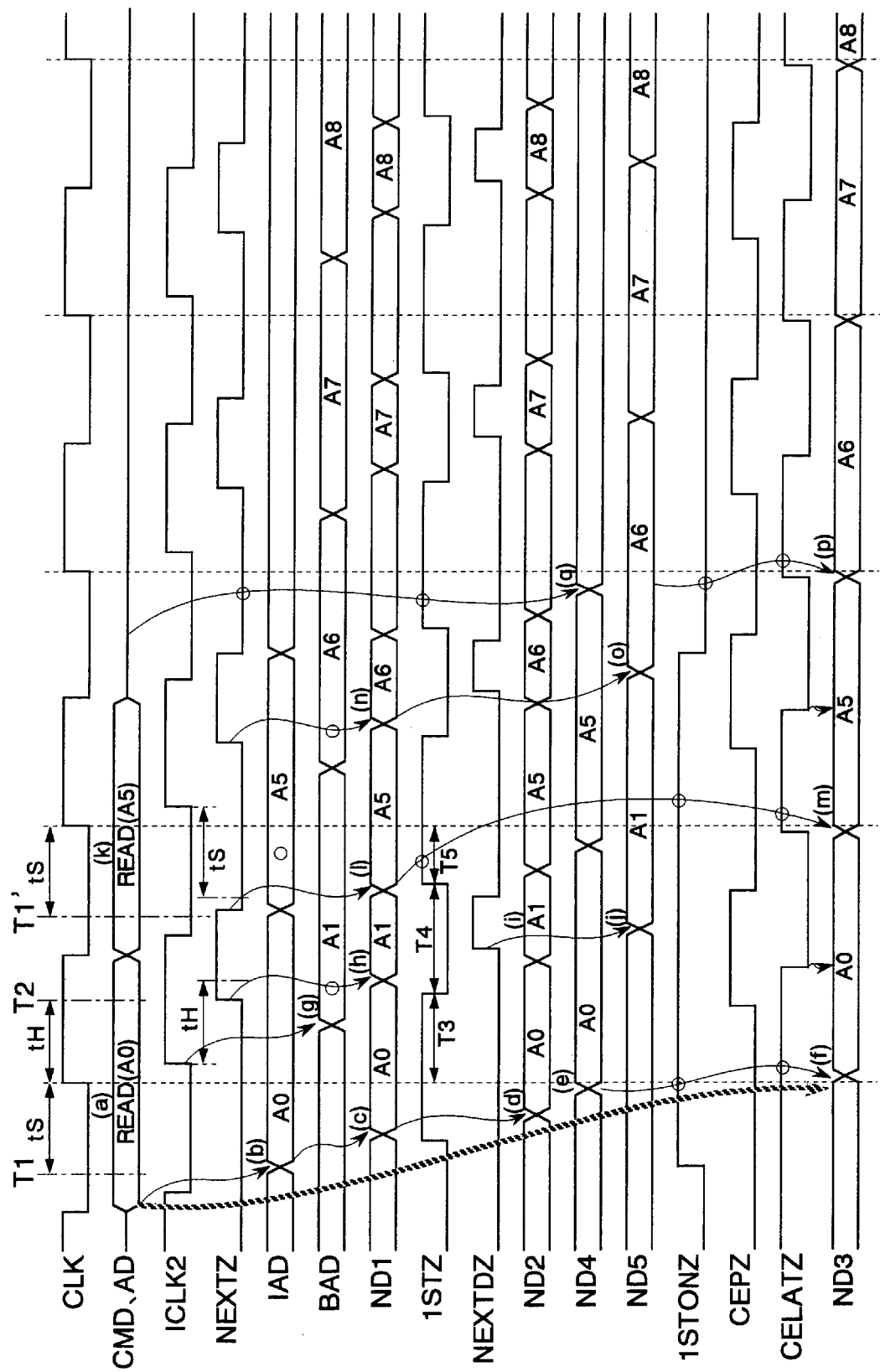
FIG. 19 is a timing diagram showing the read operation of the seventh embodiment.

FIG. 19 shows the read operation of the above-mentioned FCRAM. In this example, the read command READ is continuously supplied for the addresses A0, A5. The burst length is set to "4". The burst length is the number of data, which are continuously read (written) in correspondence with one read command (write command).

First, a system accessing the FCRAM supplies read command READ and address signal AD (address A0) before a set-up time tS prior to the rising edge of the clock signal CLK, and holds them after a hold time tH following the rising edge of the clock signal CLK (FIG. 19 (a)). The address buffer 140 shown in FIG. 17 transmits the received address signal AD, as the address signal IAD, in asynchronization with the clock signal CLK (FIG. 19(b)).

The switching circuit 148 has been turned on in response to inactivation of the control signal NEXTZ, and transmits the address signal IAD to the node ND1 (FIG. 19(c)). After the read command READ is accepted, the control signal NEXTZ is activated "burst length −1" times, in synchronization with the clock signal CLK.

The activation timing of the control signal NEXTZ is determined such that the switching circuit 148 is turned off slightly prior to the event that the end of externally supplied address signal AD is transmitted to the switching circuit 148. In other words, the activation timing of the control signal NEXTZ is determined by adding the propagation delay time of the address signal AD with respect to the switching circuit 148 to the end timing T2 of the hold time tH. On the other hand, the inactivation timing of the control signal NEXTZ is determined such that the switching circuit 148 is turned on slightly prior to the event that the externally supplied address signal AD is transmitted to the switching circuit 148. In other words, the inactivation timing of the control signal NEXTZ is determined by adding the propagation delay time of address signal AD with respect to the switching circuit 160 to the start timing T1' of the set-up time tS of the next clock cycle.

For example, if the delay time of the internal clock signal ICLK2 with respect to the clock signal CLK is equal to the delay time of the address buffer 140, then the control signal NEXTZ is activated prior to the end of the above hold time tH with respect to the rising edge of the internal clock signal ICLK2, and is inactivated prior to the beginning of the set-up time tS for the next clock cycle. As a result, the transition edge of the address signal AD supplied from the exterior is transmitted to the node ND1 within just the propagation delay time of the circuit/signal lines for the address signal AD. Also, an unknown address after the address A0 is supplied is prevented from being transmitted to the node ND1.

The address transmitted to the node ND1 is sent to the node ND2 with a delay due to the transmission delay time corresponding to the wiring length of signal lines (FIG. 19(d)). The switching circuit 160 shown in FIG. 18 is turned on when the accepting signal 1STZ is activated, and transmits the address A0 to the latching circuit 162. The latching circuit 162 latches the received address A0, and outputs the latched address A0 to the node ND4 (FIG. 19(e)).

The activation timing of the accepting signal 1STZ is set such that switching circuit 160 is turned on slightly prior to the event that the externally supplied address signal AD is transmitted to the switching circuit 160. In other words, as shown in FIG. 19, the activation timing of the accepting signal 1STZ is set by adding the propagation delay time of the address signal AD for reaching the switching circuit 160 to the start timing T1 of the set-up time tS. On the other hand, the inactivation timing of the accepting signal 1STZ is set such that the switching circuit 160 is turned off slightly prior to the event that the end of the externally supplied address signal AD is transmitted to the switching circuit 160. In other words, the inactivation timing of the accepting signal 1STZ is determined by adding the propagation delay time of the address signal AD for reaching the switching circuit 160 to the end timing T2 of the hold time tH. Further, the inactivation timing of the accepting signal 1STZ is set by adding a time that is slightly shorter than the propagation delay time of nodes ND1–ND2 to the activation timing of the control signal NEXTZ. Therefore, the burst address A1 transmitted by the activation of NEXTZ to the node ND1 is prevented from being accepted by the latching circuit 162. The accepting signal 1STZ is activated for every clock cycle in order to immediately transmit external address signal AD to the latching circuit 162 whenever command signal CMD is supplied.

The control circuit 142 shown in FIG. 17 delays the clock signal CLK by a period T3, and generates the accepting signal 1STZ by generating the low level period T4. Therefore, the period T3 between the rising edge of the clock signal CLK to the falling edge of the accepting signal 1STZ and the low level period T4 of the accepting signal 1STZ are constant, and do not depend on the frequency of the clock signal CLK. On the other hand, the time period T5 between the rising edge of the accepting signal 1STZ and the rising edge of the clock signal CLK changes depending on the frequency of the clock signal CLK. That is, the longer the clock cycle, the longer the time period T5.

The switching circuit 164 shown in FIG. 18 is turned on when it receives a control signal 1STONZ of high level, and transmits the address A0 transmitted to the node ND4 to the switching circuit 172.

When a read command READ (or a write command) is received, the control signal 1STONZ becomes a high level for a predetermined period in asynchronization with the clock signal CLK. As shown in FIG. 19, when the read command READ is continuously supplied, the control signal 1STONZ is continuously kept at its high level.

The switching circuit 172 is turned on when it receives the accepting signal CELATZ of high level, and transmits the received address A0 to the latching circuit 174. When the read command READ (or the write command) is received, the accepting signal CELATZ turns to low level in synchronization with the clock signal CLK for a predetermined period. The latching circuit 174 latches the address A0, and outputs the latched address A0 to the node ND3 (FIG. 19(f)). In other words, the address transmitted from the switching circuit 164 (or the switching circuit 170) is accepted by the latching circuit 174 in synchronization with the rising edge of the accepting signal CELATZ, and is held by the latching circuit 174 after the falling edge of the accepting signal CELATZ. Then, the predetermined banks BK1–BK4 operate to read data from a memory cell corresponding to the address A0.

As a result, as shown in FIG. 19 by the thick dashed line, the address signal A0 is transmitted from the address buffer 140 to the node ND3 in asynchronization with the clock signal CLK. Therefore, the externally supplied address signal A0 is transmitted to the predecoder 122 in the minimum time.

Here, the address A0 transmitted to the node ND2 is supplied to the redundancy comparator 158 shown in FIG. 17. The redundancy comparator 158 determines redundancy using this address A0 before the address A0 is transmitted to the node ND3. That is, the redundancy is determined before the predecoder 122 starts operating. As a result, if the supplied address A0 is the one that needs to be recovered by a redundancy circuit, a data read time is prevented from lengthening.

As shown in FIG. 17, the latching circuit 144 latches the address signal IAD in synchronization with the rising edge of the internal clock signal ICLK2, and outputs the latched signal to the burst address counter 146. The burst address counter 146 adds only one to the address signal IAD, and outputs the result as the burst address BAD (FIG. 19(g)).

The burst address counter 146 outputs the address signal added with one in synchronization with the internal clock signal ICLK "burst length −1" times as long as no interruption occur due to other command inputs.

Next, in synchronization with the rising edge of the control signal NEXTZ, the switching circuit 148 is turned off, and the switching circuit 150 is turned on. The burst address BAD (address A1) is transmitted to the node ND1 (FIG. 19(h)). The burst address BAD is transmitted to the node ND2 (FIG. 19(i)). This way, during the low-level period of the control signal NEXTZ, the address from the exterior (address signal IAD) is transmitted to the node ND1, and during the high-level period of the control signal NEXTZ, the burst address BAD is transmitted to the node ND1. Therefore, both the address signal AD and the burst address BAD are transmitted using one signal line during one clock cycle. The high-level period of control signal NEXTZ used to transmit the burst address BAD becomes substantially equal to one cycle of the clock signal CLK subtracted by the setup time tS and the hold time tH. As a result, using only one signal line (node ND1–ND2), the externally supplied address signal AD is transmitted to the internal circuit in the shortest time, and the burst address signal BAD generated in the interior of FCRAM can reliably be transmitted to the internal circuit.

The switching circuit 166 shown in FIG. 18 is turned on in synchronization with the rising edge of the accepting signal NEXTDZ, and transmits the burst address BAD (A1) to the latching circuit 168. The latching circuit 168 latches the address A1, and outputs it to the node ND5 (FIG. 19(j)). However, the switching circuit 170 has been turned off in response to the control signal 1STONZ of high level, so that the address A1 cannot be transmitted any farther.

The next read command READ and address AD (address A5) are supplied in synchronization with the next clock signal CLK (FIG. 19(k)). The control signal NEXTZ changes to its low level prior to the set-up time tS for address A5. Accordingly, the address A5 is transmitted to the node ND1 through the switching circuit 148 in asynchronization with the clock signal CLK (FIG. 19(l)).

Subsequently, the accepting signals 1STZ, CELATZ and the control signal 1STONZ are activated, and the address A5 is transmitted to the node ND3 same as above (FIG. 19(m)). Then, data are read out from a memory cell corresponding to the address A5.

As same as above, the burst address BAD (A6) is transmitted to the nodes ND1–ND5 in synchronization with the activation of the control signal NEXTZ (FIG. 19(n, o)). The burst address BAD (A6) is transmitted to the node ND3 by the control signal 1STONZ of low level and the accepting signal CELATZ of high level (FIG. 19(p)). Then, data are read from a memory cell corresponding to the address A6. Here, an externally supplied invalid address is transmitted to the node ND4 by a control signal NEXTZ of low level and an accepting signal 1STZ of high level (FIG. 19(q)). However, because the control signal 1STONZ is held at the low level thereafter, the invalid address is not transmitted to the node ND3. In other words, the address signal AD is transmitted to the node ND4 with the minimum time, and the burst address signal BAD corresponding to the previous command signal CMD is transmitted to the node ND5 whenever the command signal CMD and the address signal AD from the exterior are provided in any clock cycle. Also, by the control signal 1STONZ that varies in accordance with the command signal CMD, the address signal AD or the burst address signal BAD is transmitted to the node ND3.

Thereafter, the burst address BAD (addresses A7, A8) is generated in sequence. Because a new command signal CMD is not supplied, the control signal 1STONZ is held at its low level. Then, the burst address BAD (addresses A7, A8) is transmitted to the node ND3 in sequence, and a read operation is executed.

As described above, in this embodiment, the control signal NEXTZ is activated during a predetermined period in synchronization with the clock signal CLK. The externally supplied address signal AD is transmitted to the internal circuit when the control signal NEXTZ is in its inactivated state. The burst address signal BAD is transmitted to the internal circuit when the control signal NEXTZ is in its activated state. Therefore, within one clock cycle, both the address signal AD and the burst address signal BAD can be transmitted to the internal circuit in sequence.

The address signal AD is transferred to the memory core side in a synchronization with the clock signal CLK. Therefore, the transition edge of the externally supplied address signal AD can be transmitted to the predecoder 122 of the memory core in asynchronization with the clock signal CLK. The read operation time and the write operation time of the memory cell corresponding to the address signal AD can be shortened. As a result, the frequency of the clock signal CLK can be made high to operate FCRAM at a high speed.

The address signal AD and the burst address signal BAD are transmitted to the memory core side using the same signal line (nodes ND1–ND2). Accordingly, the number of the signal lines for address signals can be reduced. The signal path from the input circuit to the memory core is generally long. Also, because the address signal AD is constructed of a plurality of bits, the number of signal lines is large. Therefore, reduction in the number of signal lines can significantly reduce the chip size.

At the address control unit 134, the accepting signal 1STZ for accepting the address signal AD is activated in a synchronization with the clock signal CLK, and is inactivated in synchronization with the clock signal CLK. That is, the accepting signal 1STZ is activated in accordance with the inactivation period of the control signal NEXTZ. The accepting signal NEXTDZ for accepting the burst address signal BAD is activated in accordance with the activation period of the control signal NEXTZ. As a result, the address signal AD and the burst address signal BAD that are transmitted through the same signal line can reliably be separated.

The control signal 1STONZ is activated for a predetermined period in response to the command signal CMD that is supplied in asynchronization with the clock signal CLK. When the control signal 1STONZ is activated, the switching circuits 164, 170 select the address signal AD held in the latching circuit 162. When the control signal 1STONZ is inactivated, the switching circuits 164, 170 select the burst address signal BAD held in the latching circuit 168. As a result, even at the memory core side, in correspondence with the input circuit side, the address signal AD can be selected in asynchronization with the clock signal CLK, and the burst address signal BAD can be selected in synchronization with the clock signal CLK.

Figure 20:
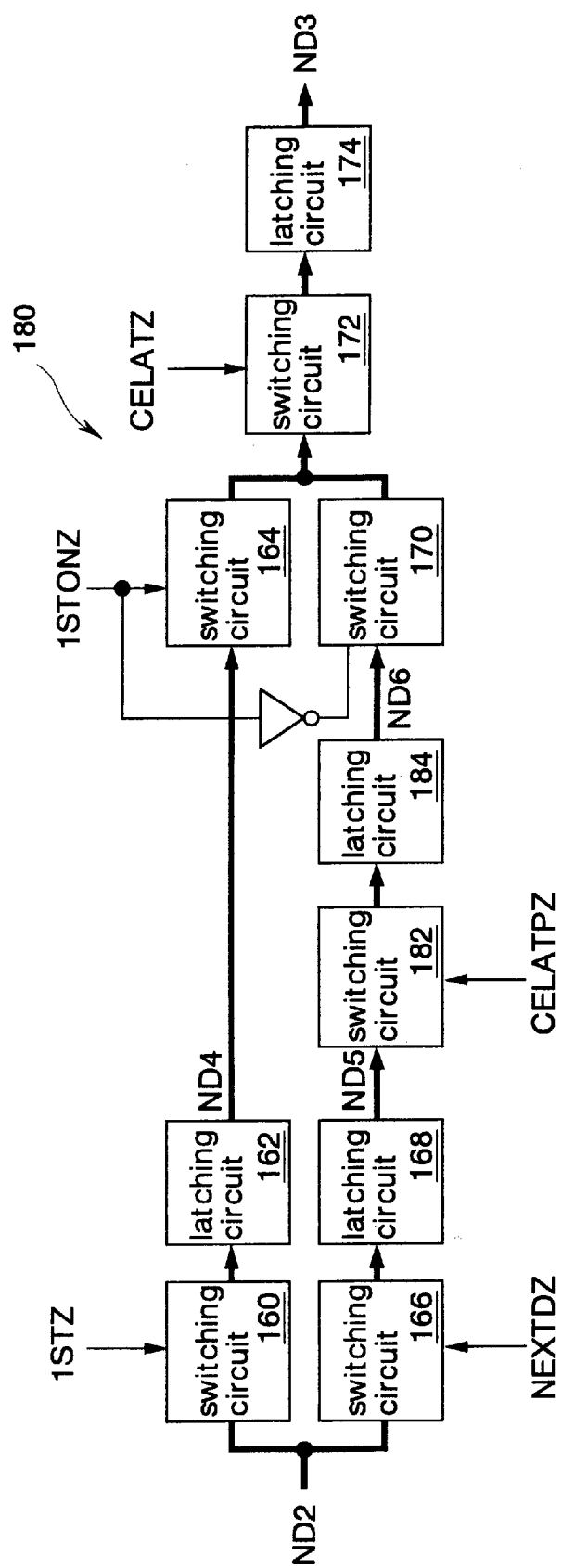
FIG. 20 is a block diagram showing a control circuit 180 of the eighth embodiment in the present invention.

FIG. 20 shows the eighth embodiment of the semiconductor integrated circuit in the present invention. The same constituents as in the seventh embodiment are referred to the same reference numerals and the detailed descriptions thereof will be omitted here.

In this embodiment, the control circuit 142 and the control circuit 156 shown in FIG. 17 are different from those of the seventh embodiment. The other construction is the same as that of the seventh embodiment.

In a control circuit 180 that corresponds to the control circuit 156 in FIG. 18, a switching circuit 182 and a latching circuit 184 are additionally connected between the latching circuit 168 and switching circuit 170 of the control circuit 156. The switching circuit 182 and the latching circuit 184 are circuits for adjusting time for the burst address to be transmitted to the node ND3. The switching circuit 182 is turned on when the control signal CELATPZ is activated, and transmits the burst address latched at the latching circuit 168 to the latching circuit 184. The latching circuit 184 latches the received burst address, and outputs it to the switching circuit 170. A control signal CELATPZ is created by delaying the control signal CEPZ for a specified time through the timing control circuit 152 shown in FIG. 17.

The activation timing of the column switch and the activation timings of the control signal CEPZ and the accepting signal CELATZ, which are related to control of the column switch, are set to be later than those of the seventh embodiment. The activation timing of the control signal CELATPZ varies in cooperation with the activation timing of the column switch and the activation timings of the control signal CEPTZ and the accepting signal CELATZ. Other control signal timings are the same as those of the seventh embodiment.

Figure 21:
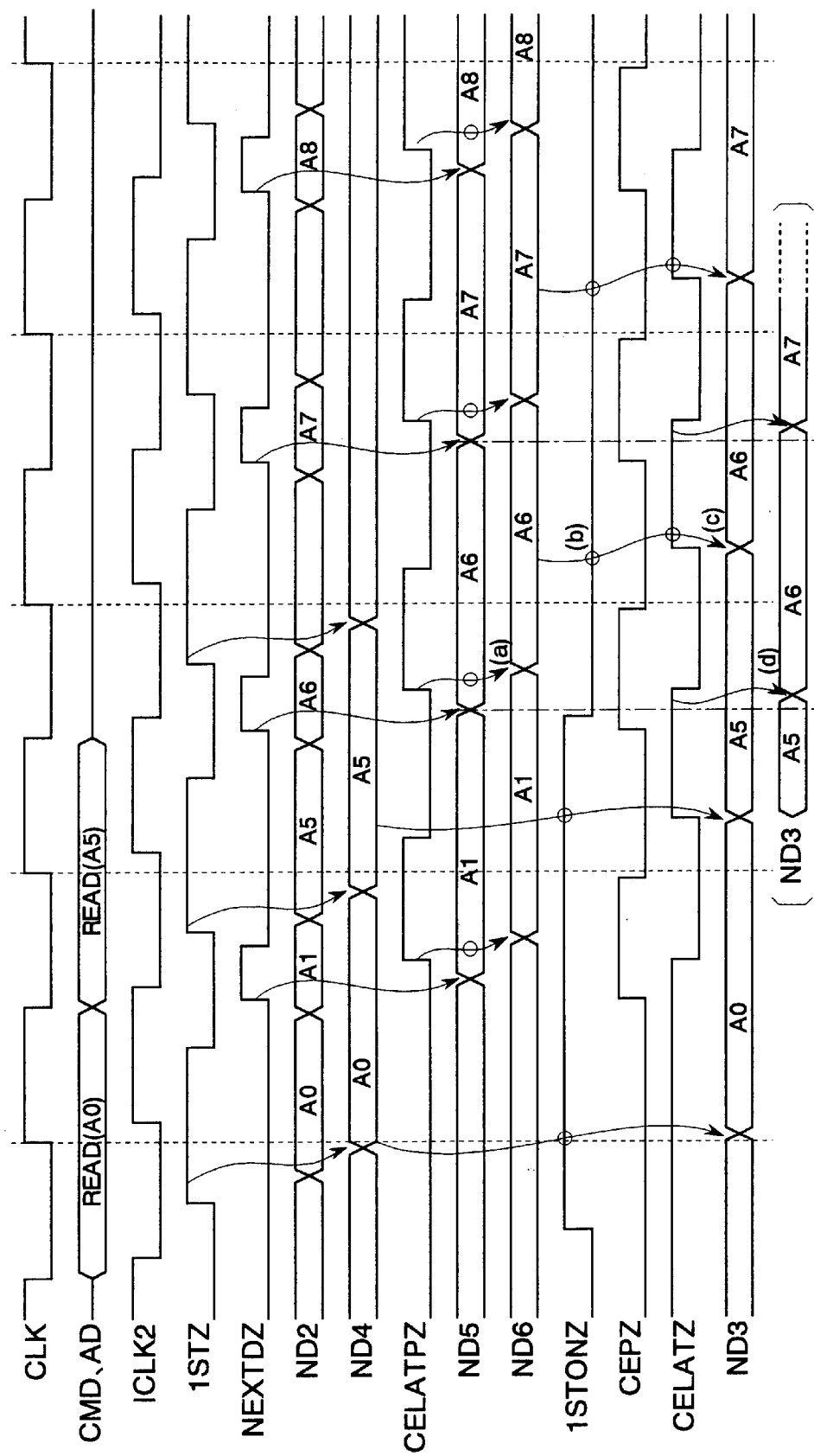
FIG. 21 is a timing diagram showing the read operation of the eighth embodiment.

FIG. 21 shows the read operation of the FCRAM described above. In this example, only differences from FIG. 19 are explained.

In the clock cycle during which the read command READ and the address signal AD (address A5) are accepted, the switching circuit 182 shown in FIG. 20 is turned on when the control signal CELATPZ is activated, and transmits the burst address A6 transmitted to the node ND5 to the latching circuit 184. The latching circuit 184 latches the burst address A6, and outputs the latched burst address A6 to the node ND6 (FIG. 21(a)). The switching circuit 170 is turned on when the control signal 1STONZ is in its low level, and transmits the burst address A6 transmitted to the node ND6 to the switching circuit 172 (FIG. 21(b)). The switching circuit 172 is turned on when the accepting signal CELATZ is activated, and transmits the burst address A6 to the latching circuit 174. The latching circuit 174 outputs the latched burst address A6 to the node ND3 (FIG. 21(c)). This way, even when the activation timings of the control signal CEPZ and the accepting signal CELATZ are delayed in synchronization with the activation timing of the column switch, the correct address can be transmitted to the node ND3.

FIG. 21(d) shows an example where the burst address A6 transmitted to the node ND5 is transmitted directly to the switching circuit 170 without forming the latching circuits 182, 184. In this case, the burst address A6 at the node ND5 is transmitted to the node ND3 during the activation period of the accepting signal CELATZ. As a result, the column switch to be activated cannot be activated, which results in malfunctioning.

In this embodiment, the same effects as in the above seventh embodiment can be attained. Moreover, in this embodiment, the transmission timing of the burst address that is being transmitted to the node ND3 is varied in cooperation with the activation timing of the column switch and the activation timings of the control signal CEPZ and the accepting signal CELATZ. Therefore, in the present embodiment, it is possible to prevent an incorrect burst address from being transmitted to the internal circuit, which also prevents malfunctioning due to the erroneous activation of the column switch.

This embodiment can be used in an FCRAM having a specification that the column switch is activated a predetermined time after the command signal CMD is provided irrelevant to the clock frequency. As a result, fluctuations in the access time depending on the clock frequency can be prevented.

Incidentally, the example in which the present invention is applied to the SDRAM has been mentioned in the first embodiment above. The present invention, however, is not limited to such embodiment. For example, the present invention may be applied to semiconductor memories such as DRAM, SRAM, FeRAM (Ferroelectric RAM) and flash memory. Alternatively, it may well be applied to a system LSI in which the memory core of the DRAM is implemented.

Besides, a semiconductor manufacturing process to which the present invention is applied is not limited to the CMOS process, but it may well be a Bi-CMOS process.

The first embodiment has been described on the example in which the latched command signal LCMD accepted by the latching circuit 26, is decoded by the command decoder 28. The present invention, however, is not limited to such embodiment. For instance, a command signal decoded by a command decoder may well be latched by a latching circuit.

In addition, the foregoing embodiments have been described on the example in which the pulse extension circuit 32 or the pulse generator 96 holds the pulse signal PLSX at low level during the predetermined period. The present invention, however, is not limited to such an aspect. By way of example, the low-level period may well be varied in accordance with an operating frequency. Alternatively, the low-level period may well be varied in accordance with the number of those clock cycles of the clock signal CLK from the receipt of the command signal CMD to the performance of the read operation or the write operation. In this case, the low-level period of the pulse signal PLSX can be optimally set in accordance with the frequency of the clock signal CLK. As a result, the address signal AD corresponding to the next command signal, for example, can be received at the optimum timing. Moreover, any unnecessary address signal can be prevented from being fed to the chip controlling unit and the core controlling unit. As a result, the operations of the internal circuit can be minimized, and the power consumption thereof can be reduced.

The low-level period of the pulse signal PLSX can be set in accordance with the value of a mode register which can be externally set. In this case, the low-level period can be optimally set in accordance with the frequency of the clock signal CLK for use or the factor of an operation environment such as temperature, when the semiconductor integrated circuit is to be operated or while it is being operated.

In addition, the low-level period of the pulse signal PLSX can be set in accordance with the value of a control signal which is fed from the exterior. In this case, the low-level period can be optimally set in accordance with the frequency of the clock signal CLK for use, when the semiconductor integrated circuit is to be operated or when the semiconductor integrated circuit is mounted on a printed-wiring board.

Besides, the low-level period of the pulse signal PLSX can be set in accordance with the presence or absence of the blowout of the implemented fuses. In this case, the low-level period can be optimally set by blowing out or not blowing out the fuses in accordance with the operating characteristics evaluated with a probing test.

Furthermore, the low-level period of the pulse signal PLSX can be set in accordance with the voltage applied to pads formed on the chip. In this case, for example, it is possible to optimally set the low-level period by changing the connection of a bonding wire connected to a bonding pad in the assembling process of the semiconductor integrated circuit.

In the seventh embodiment above, an example in which the present invention is applied to an FCRAM has been described. However, this invention is not limited to such an embodiment. For example, the present invention can be applied to semiconductor memories such as SDRAM, SRAM, FeRAM (Ferroelectric RAM), FLASH memory or the like, and to system LSIs implementing a memory core of DRAM.

Moreover, in the seventh embodiment, this invention may be applied to an FCRAM equipped with SDRAM interfaces. In this case, the FCRAM receives address signal AD in the form of a column address and a row address (address multiplex method), selects a word line in accordance with the column address, and executes the read operation or write operation in accordance with the row address.

In the above seventh embodiment, the present invention has been applied on an example where an address signal AD supplied from the exterior and a burst address signal BAD generated by the address signal AD are transmitted to the internal circuit. However, the present invention is not limited to such an embodiment. For example, it can be applied to the case of transmitting a write enable signal /WE supplied from the exterior for indicating a write/read operation and a burst write signal (or a burst read signal) generated in sequence based on the write enable signal /WE to the internal circuit. In this case, the write and read operations can be judged at a high speed. Also, the present invention can be applied to the case of transmitting a bank select signal supplied from the exterior for selecting banks BK1–BK4 and a burst bank select signal generated in sequence based on the bank select signal to the internal circuit. In this case, banks BK1–BK4 to be operated can be selected at a high speed.

The invention is not limited to the above embodiments and various modifications may be made without departing from the spirit and the scope of the invention. Any improvement may be made in part or all of the components.

What is claimed is:

1. A semiconductor integrated circuit comprising:
   a command receiving circuit receiving a command signal which indicates an operation mode of an internal circuit, in synchronization with a clock signal and outputting an internal command signal to the internal circuit and
   an address switching circuit permitting a transmission of an address signal to said internal circuit upon receiving said command signal and inhibiting said transmission of said address signal upon receiving said internal command signal.

2. A semiconductor integrated circuit according to claim 1, comprising:
   a memory core including a plurality of memory cells and a word line connected to the memory cells;
   a burst address counter generating a burst address signal for performing a burst operation, wherein said memory cells connected to the same word line are continuously accessed; and
   a burst switching circuit permitting a transmission of said burst address signal to said internal circuit upon receiving said command signal for performing said burst operation and inhibiting said transmission upon receiving said internal command signal for performing said burst operation.

3. A semiconductor integrated circuit according to claim 1, comprising:
   a plurality of memory cores;
   a redundancy circuit relieving defect in the memory core; and
   a redundancy comparator comparing said address signal outputted from said address switching circuit with a defect address.

4. A semiconductor integrated circuit according to claim 1, comprising a memory core including a plurality of memory cells, and wherein
   said command signal performs a read or a write operation in said memory core.

5. A semiconductor integrated circuit according to claim 1, comprising a memory core including a plurality of memory cells and a word line connected to the memory cells, and wherein
   said command signal activates said word line.

6. A semiconductor integrated circuit according to claim 1, wherein a period during which said address switching circuit inhibits said transmission is variable.

7. A semiconductor integrated circuit according to claim 6, wherein said period, during which said transmission is inhibited, is modified in accordance with the number of the clock cycles of said clock signal from the receipt of said command signal to the performance of a read or a write operation.

8. A semiconductor integrated circuit according to claim 6, wherein said period, during which said transmission is inhibited, is modified in accordance with the value of a register which can be set from the exterior.

9. A semiconductor integrated circuit according to claim 6, wherein said period, during which said transmission is inhibited, is modified in accordance with the value of a control signal fed from the exterior.

10. A semiconductor integrated circuit according to claim 6, wherein said period, during which said transmission is inhibited, is set by blowing out implemented fuses.

11. A semiconductor integrated circuit according to claim 1, comprising a memory core including:
    a plurality of memory cells;
    a plurality of word lines and a plurality of bit lines both connected to said memory cells;
    a plurality of sense amplifiers respectively connected to said bit lines and amplifying data transmitted to said bit lines; and
    a plurality of column switches respectively connected to said bit lines and transmitting data to said bit lines;
    wherein an initial turning on of said column switches after activation of said word line during a read operation is irrelevant to the activation timings of said sense amplifiers.

12. A semiconductor integrated circuit according to claim 1, comprising:
    a plurality of memory cores; and
    a redundancy circuit relieving defect in said memory cores and a redundancy comparator for comparing said address signal and said defect address respectively corresponding to each of said memory cores; and wherein
    each of said redundancy comparator compares said address signal and said defect address irrespective of the selection or unselection of said memory cores by said address signal.

13. A semiconductor integrated circuit according to claim 1, comprising:
    a plurality of memory cores; and
    a redundancy circuit relieving defect in said memory cores and a redundancy comparator comparing said address signal and said defect address corresponding to each of said memory cores; and wherein
    said address signal and said defect address are compared only by said redundancy comparator corresponding to a memory core of said memory core selected by said address signal.

14. A semiconductor integrated circuit according to claim 1, comprising:
    a plurality of memory cores and
    a bank switch feeding said address signal transmitted through said address switching circuit, to predetermined memory core(s) of said memory cores in accordance with the value of said address signal.

15. A semiconductor integrated circuit according to claim 14, wherein:
    each said bank switch is respectively comprised in said memory cores; and
    each said bank switch inhibits said transmission of said address signal when the corresponding memory core is operated.

16. A semiconductor integrated circuit according to claim 15, wherein:
    each said bank switch is respectively comprised in said memory cores; and
    each said bank switch inhibits said transmission of said address signal when the corresponding memory core is not operated.

17. A semiconductor integrated circuit comprising:
    a command receiving circuit receiving a command signal which indicates an operation mode of an internal circuit, in synchronization with a clock signal and outputting an internal command signal to said internal circuit; and
    an address switching circuit permitting a transmission of an address signal to said internal circuit upon receiving said command signal and inhibiting said transmission upon receiving said clock signal.

18. A semiconductor integrated circuit according to claim 17, comprising:
    a memory core including a plurality of memory cells and a word line connected to the memory cells;
    a burst address counter generating a burst address signal for performing a burst operation, wherein said memory cells connected to the same word line are continuously accessed; and
    a burst switching circuit permitting a transmission of said burst address signal to said internal circuit upon receiving said command signal for performing said burst operation and inhibiting said transmission to said internal circuit upon receiving said clock signal.

19. A semiconductor integrated circuit according to claim 17, comprising:
    a plurality of memory cores;
    a redundancy circuit relieving defect in the memory core; and
    a redundancy comparator comparing said address signal outputted from said address switching circuit with a defect address.

20. A semiconductor integrated circuit according to claim 17, comprising a memory core including a plurality of memory cells, and wherein said command signal performs a read or a write operation in said memory core.

21. A semiconductor integrated circuit according to claim 17, comprising a memory core including a plurality of memory cells and a word line connected to the memory cells, and wherein said command signal activates said word line.

22. A semiconductor integrated circuit according to claim 17, wherein a period during which said address switching circuit inhibits said transmission is variable.

23. A semiconductor integrated circuit according to claim 22, wherein said period, during which said transmission is inhibited, is modified in accordance with the number of the clock cycles of said clock signal from the receipt of said command signal to the performance of a read operation or a write operation.

24. A semiconductor integrated circuit according to claim 22, wherein said period, during which said transmission is inhibited, is modified in accordance with the value of a register which can be set from the exterior.

25. A semiconductor integrated circuit according to claim 22, wherein said period, during which said transmission is inhibited, is modified in accordance with the value of a control signal fed from the exterior.

26. A semiconductor integrated circuit according to claim 22, wherein said period, during which said transmission is inhibited, is set by blowing out implemented fuses.

27. A semiconductor integrated circuit according to claim 17, comprising a memory core including:

a plurality of memory cells;

a plurality of word lines and a plurality of bit lines both connected to said memory cells;

a plurality of sense amplifiers respectively connected to said bit lines and amplifying data transmitted to said bit lines; and a plurality of column switches respectively connected to said bit lines and transmitting data to said bit lines;

wherein an initial turning on of said column switches after activation of said word line during a read operation is irrelevant to the activation timings of said sense amplifiers.

28. A semiconductor integrated circuit according to claim 17, comprising:

a plurality of memory cores; and a redundancy circuit relieving defect in said memory cores and a redundancy comparator for comparing said address signal and said defect address respectively corresponding to each of said memory cores; and wherein each of said redundancy comparator compares said address signal and said defect address irrespective of the selection or unselection of said memory cores by said address signal.

29. A semiconductor integrated circuit according to claim 17, comprising:

a plurality of memory cores; and a redundancy circuit relieving defect in said memory cores and a redundancy comparator comparing said address signal and said defect address corresponding to each of said memory cores; and wherein said address signal and said defect address are compared only by said redundancy comparator corresponding to a memory core of said memory core selected by said address signal.

30. A semiconductor integrated circuit according to claim 17, comprising:

a plurality of memory cores; and a bank switch feeding said address signal transmitted through said address switching circuit, to predetermined memory core(s) of said memory cores in accordance with the value of said address signal.

31. A semiconductor integrated circuit according to claim 30, wherein:

each said bank switch is respectively comprised in said, memory cores; and each said bank switch inhibits said transmission of said address signal when the corresponding memory core is operated.

32. A semiconductor integrated circuit according to claim 31, wherein:

each said bank switch is respectively comprised in said memory cores; and each said bank switch inhibits said transmission of said address signal when the corresponding memory core is not operated.

33. A semiconductor integrated circuit, comprising:

a memory core including a plurality of memory cells;

an address input circuit receiving an external address signal in asynchronization with a clock signal;

an address generating circuit generating an internal address signal based on said external address signal received by said address input circuit; and a first switching circuit selecting said external address signal when a first control signal is inactivated and selecting said internal address signal when the first control signal is activated, and wherein:

said first control signal is activated during a predetermined period in synchronization with said clock signal; and the address signal selected by said first switching circuit is transmitted to said memory core through the common signal line.

34. A semiconductor integrated circuit according to claim 33, wherein said internal address signal is generated in synchronization with said clock signal.

35. A semiconductor integrated circuit according to claim 33, further comprising:

a command input circuit receiving a command signal which indicates an operation mode of an internal circuit, in asynchronization with said clock signal;

a first holding circuit accepting said address signal transmitted to said memory core through said signal line when a first accepting signal is activated; and a second holding circuit accepting said address signal transmitted to said memory core through said signal line when a second accepting signal is activated, and wherein:

said first accepting signal is activated in response to said command signal and is inactivated in synchronization with said clock signal; and said second accepting signal is activated during a predetermined period in synchronization with said first control signal.

36. A semiconductor integrated circuit according to claim 35, wherein said second accepting signal is activated during the inactivation period of said first accepting signal.

37. A semiconductor integrated circuit according to claim 35, further comprising a second switching circuit selecting said address signal held in said first holding circuit when said second control signal is activated and selecting said internal address signal held in said second holding circuit when said second control signal is inactivated, and wherein said second control signal is activated during a predetermined period in response to said command signal.

38. A semiconductor integrated circuit according to claim 37, wherein:

said memory core includes bit lines connected to said memory cells, and column switches which are activated in accordance with said address signal to transmit data to the bit lines;

said internal address signal is a burst address signal for use in a burst operation wherein said memory cells connected to the same word line are continuously accessed; and the transmission timing of said internal address signal to be supplied to said second switching circuit varies in accordance with the activation timing of said column switches.

39. A semiconductor integrated circuit according to claim 33, wherein said internal address signal is a burst address signal for use in a burst operation wherein said memory cells connected to said same word line are continuously accessed.

40. A semiconductor integrated circuit, comprising:

an address input circuit receiving an external address signal in asynchronization with a clock signal; and a memory core having a plurality of memory cells and a decoder decoding an address signal from said address input circuit, and wherein a transition edge of said external address signal is transmitted to said decoder in asynchronization with said clock signal.

41. A method of operating a semiconductor integrated circuit, comprising the steps of:

permitting a transmission of an address signal to an internal circuit before receiving a command signal which indicates an operation mode of said internal circuit, in synchronization with a clock signal and inhibiting said transmission of said address signal after the receipt of said command signal.

* * * * *